(12) United States Patent
Ogata et al.

(10) Patent No.: US 8,097,485 B2
(45) Date of Patent: Jan. 17, 2012

(54) SOLID STATE IMAGE PICKUP DEVICE AND MANUFACTURING METHOD THEREOF

(75) Inventors: Keisuke Ogata, Tokyo (JP); Kenzo Fukuyoshi, Tokyo (JP); Tadashi Ishimatsu, Tokyo (JP); Mitsuhiro Nakao, Tokyo (JP); Satoshi Kitamura, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 380 days.

(21) Appl. No.: 11/889,070

(22) Filed: Aug. 8, 2007

(65) Prior Publication Data

US 2007/0298164 A1 Dec. 27, 2007

Related U.S. Application Data

(63) Continuation of application No. PCT/JP2006/302061, filed on Feb. 7, 2006.

(30) Foreign Application Priority Data

Feb. 10, 2005 (JP) ................................. 2005-034620
Feb. 10, 2005 (JP) ................................. 2005-034621

(51) Int. Cl.
*H01L 21/00* (2006.01)
(52) U.S. Cl. ............... 438/70; 438/69; 438/64; 438/65; 257/440; 257/294
(58) Field of Classification Search .............. 257/440, 257/294; 438/70, 57, 64, 65, 69
See application file for complete search history.

(56) References Cited

U.S. PATENT DOCUMENTS

| | | | | |
|---|---|---|---|---|
| 5,719,074 A | * | 2/1998 | Hawkins et al. | 438/70 |
| 5,994,721 A | * | 11/1999 | Zhong et al. | 257/89 |
| 6,567,139 B2 | * | 5/2003 | Huang | 349/110 |
| 2004/0164672 A1 | * | 8/2004 | Kawaguchi et al. | 313/506 |
| 2005/0128509 A1 | * | 6/2005 | Tokkonen et al. | 358/1.15 |

FOREIGN PATENT DOCUMENTS

| | | |
|---|---|---|
| JP | 63-188104 | 8/1988 |
| JP | 64-2002 | 1/1989 |
| JP | 2-15201 | 1/1990 |
| JP | 5-27117 | 2/1993 |

(Continued)

OTHER PUBLICATIONS

International Search Report issued Apr. 11, 2006 in corresponding PCT Application No. PCT/JP2006/302061 (4 pp).
International Preliminary Examination Report issued Apr. 18, 2006 in corresponding PCT Application No. PCT/JP2006/302061 (4 pp).
International Preliminary Report on Patentability issued in corresponding International Application No. PCT/JP2006/302061, mailed on Aug. 23, 2007.

(Continued)

*Primary Examiner* — Thanh V Pham
*Assistant Examiner* — Maria Ligai

(57) ABSTRACT

A method of manufacturing a solid state image pickup device including photoelectric conversion elements which are two-dimensionally arranged in a semiconductor substrate, and a color filter having a plurality of color filter patterns differing in color from each other and disposed on a surface of the semiconductor substrate according to the photoelectric conversion elements. The method including the steps of successively subjecting a plurality of filter layers differing in color from each other to a patterning process to form the plurality of color filter patterns. At least one color filter pattern to be formed at first among the plurality of color filter patterns is formed by means of dry etching, and the rest of the plurality of the color filter pattern is formed by means of photolithography.

2 Claims, 10 Drawing Sheets

FOREIGN PATENT DOCUMENTS

| | | |
|---|---|---|
| JP | 6-289217 | 10/1994 |
| JP | 11-68076 | 3/1999 |
| JP | 2004-228398 | 8/2004 |
| JP | 2004-335598 | 11/2004 |

OTHER PUBLICATIONS

Taiwanese Office Action issued on Nov. 26, 2008 in corresponding Taiwanese Patent Application 09720647950.

* cited by examiner

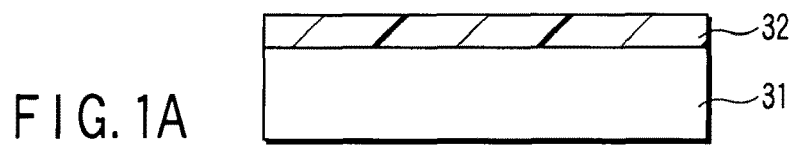
F I G. 1A
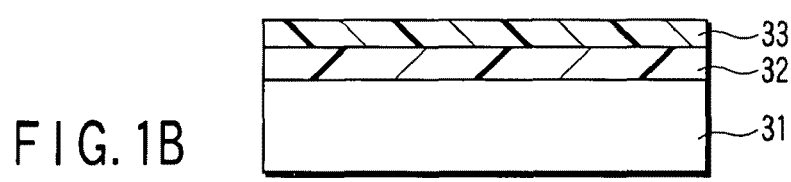
F I G. 1B
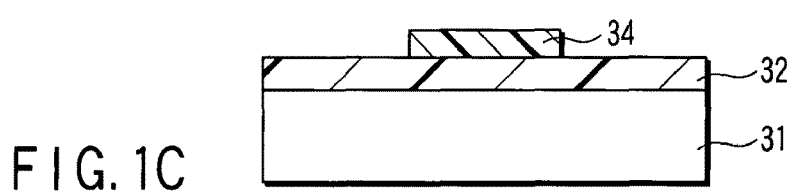
F I G. 1C
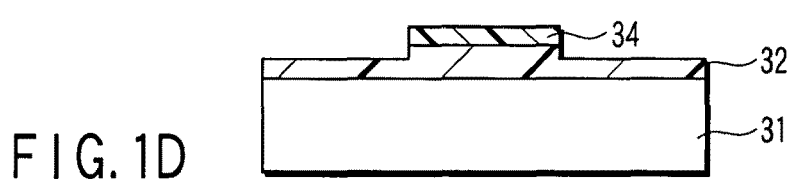
F I G. 1D
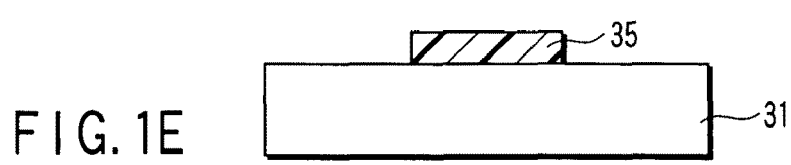
F I G. 1E

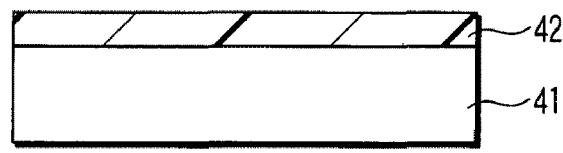
F I G. 2A
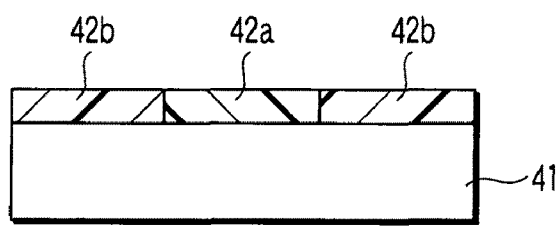
F I G. 2B
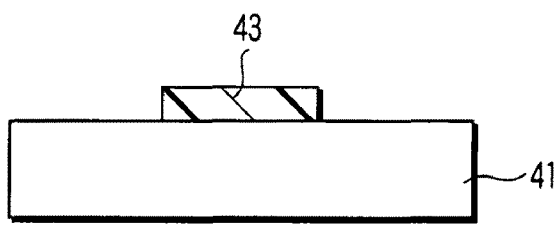
F I G. 2C
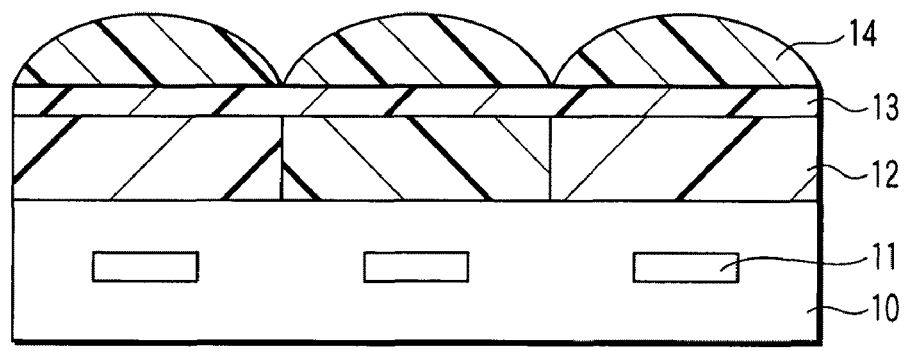
F I G. 3

SOLID STATE IMAGE PICKUP DEVICE AND MANUFACTURING METHOD THEREOF

CROSS REFERENCE TO RELATED APPLICATIONS

This is a Continuation Application of PCT Application No. PCT/JP2006/302061, filed Feb. 7, 2006, which was published under PCT Article 21(2) in Japanese.

This application is based upon and claims the benefit of priority from prior Japanese Patent Applications No. 2005-034620, filed February 10, 2005; and No. 2005-034621, filed Feb. 10, 2005, the entire contents of both of which are incorporated herein by reference.

BACKGROUND OF THE INVENTION

1. Field of the Invention

This invention relates to a solid state image pickup device represented by a photoelectric conversion element such as a C-MOS, CCD, etc., and also to a method for manufacturing the solid state image pickup device. In particular, this invention relates to a color filter to be configured in conformity with a photoelectric conversion element.

2. Description of the Related Art

A solid state image pickup device, such as a CCD, C-MOS, etc., which is adapted to be mounted in a digital camera has been increasingly enhanced in terms of the number of pixel (picture elements) as well as the fineness of pixels in recent years. In the case of a solid state image pickup device having especially fine pixels, the pixel size is reduced to a level of less than 2 µm×2 µm.

Further, the solid state image pickup device is now configured to have color filters corresponding to photoelectric conversion elements, thereby enabling it to reproduce full color. As for the method of forming the color filter, there has been generally employed a technique of forming a pattern by means of photolithography process (see for example, JP Patent Laid-open Publication (Kokai) No. 11-68076 (1999).

Meanwhile, the region (aperture) which is available to the photoelectric conversion element of solid state image pickup device for the photoelectric transferring is limited to about 20 to 40% based on the entire area of the solid state image pickup device though it depends on the size of the solid state image pickup device and on the number of pixel. Therefore, as the aperture is small in size, it will inevitably result in the deterioration of sensitivity of the solid state image pickup device. In order to make up for this problem, it is generally practiced to provide a condensing micro-lens over the photoelectric conversion element.

However, there has been increasing demand in recent years for a highly refined solid state image pickup device having as many pixels of not less than six millions and hence the size of pixel of color filter to be mounted together with the solid state image pickup device is, in many cases, confined to a level of less than 2 µm×2 µm. This in turn raises a problem that due to insufficient resolution of the color filter to be formed by means of photolithography process, the properties of the solid state image pickup device are badly affected. This insufficiency of resolution is manifested as color uneven originating from the malformation of pattern as the size of pixel becomes as small as not more than 2.5 µm or around 1.8 µm.

Namely, as the size of pixel becomes smaller, the aspect ratio of pattern becomes larger (the thickness of pattern becomes larger relative to the width thereof), so that it is impossible to completely eliminate a portion of color filter that should be essentially eliminated (a portion other than the effective region of pixel), thus permitting it to remain as a residue giving an adverse influence to the pixels of other colors. With a view to overcome this problem, a method has been tried to prolong the developing time. However, this raises another problem that when the developing time is prolonged, a portion of the color filter (pixel) that has been cured and essentially required to remain may be also peeled away.

Further, in the case of the patterning by means of photolithography, there will be raised a phenomenon that the edge portion of pattern of color filter is caused to rise (i.e., a horn-like edge is caused to be generate). Especially when the size of pixel becomes smaller, the properties of the color filter would be adversely affected by this horn-like edge, giving rise to the generation of color uneven.

If it is desired to secure satisfactory spectral characteristics, it would be inevitable to increase the film thickness of the color filter. When the film thickness of the color filter is increased, the edge portion of the pattern of color filter tends to become roundish as the fineness of the pixel is further advance, thus more likely deteriorating the resolution of the color filter. The color filter is generally formed by making use of a photosensitive resin incorporating color pigments. Therefore, when the concentration of pigments included in color filter layers is increased, a quantity of light which is required for the photo-setting reaction of the resin may not reach to the bottom of the color filter layers, thus making it impossible to sufficiently cure the photosensitive resin. As a result, there will be raised a problem that the color filter layers may be peeled off in the developing process of photolithography and hence defective pixels would be caused to be generated.

Furthermore, when the color filter is formed thick, in addition to the aforementioned problems involved in the manufacturing process thereof, there is another problem that the light entering obliquely into a portion of the color filter pattern may be permitted to pass, through a neighboring portion of the color filter pattern, into a photoelectric conversion element, thus raising problems such as mixing of colors and deterioration of sensitivity. This problem becomes more prominent as the size of pixel of the color filter becomes smaller.

In view of the aforementioned phenomena, when it is desired to increase the number of pixel of the solid image pickup element, the problem which is important to deal with is how to make thinner the color filter layer in addition to achieving a highly refined pattern of the color filter.

Incidentally, the problem of color mixing of incident light would be raised even in a case where the distance between the color filter and the photoelectric conversion element is relatively large.

The decrease of aperture ratio of the micro-lens (i.e., decrease of photosensitivity) to be mounted on the highly refined solid state image pickup device and also the deterioration in quality of image due to the increase of noise such as flare and smear are now becoming great issues to be dealt with. Therefore, it has been considered necessary to enhance the converging property of incident light entering into the photoelectric conversion element by making use of micro-lens and to minimize the under-lens distance for enhancing the S/N ratio at the photoelectric conversion element. If the under-lens distance is relatively large, a couple of problems will be raised as follows.

First, if the under-lens distance is relatively large, the uptake angle of incident light becomes smaller, so that the quantity of incident light is decreased, thus providing a dark display as a whole. Secondary, in the case of a camera using a photoelectric conversion element such as a CMOS or CCD, the angle of incident light is generally caused to change depending on the magnitude of diaphragm (F number) of the objective lens. Therefore, when the diaphragm is actuated to move to the full open side, oblique incident light is caused to increase, thus deteriorating the converging property of incident light and hence deteriorating the sensitivity of the photoelectric conversion element. Additionally, since the angle of incident light is caused to differ prominently between a central portion and a peripheral portion of the pixel region of semiconductor chip where a photoelectric conversion element is formed, the quantity of incident light entering into the pixels (photoelectric conversion elements) of the peripheral portion is caused to decrease, thus presenting a dark display at the peripheral portion of the display picture.

The color filter is generally formed on a flattening layer that has been formed in advance on a semiconductor substrate for the purpose of enhancing the adhesion of the color filter to the underlying layer. However, if it is desired to minimize the aforementioned under-lens distance and to miniaturize the solid state image pickup device, it is desirable to dispense with the flattening layer. However, since a color resist to be employed in the photolithography process is poor in adhesion to a semiconductor substrate, it will be peeled away in the developing step. Therefore, it has been considered difficult to dispense with the flattening layer.

With a view to overcoming this problem, there has been proposed a method wherein the surface of semiconductor substrate is treated with chemicals so as to introduce a functional group exhibiting excellent bonding property to a resin into the surface of semiconductor substrate. Even with this method however, it has been impossible to secure a sufficient adhesion of the color filter to the surface of semiconductor substrate.

Meanwhile, the color filter is generally constituted by filters of three primary colors, i.e., blue, green and red filters. There has been a problem however in designing the solid state image pickup device that, due to the characteristics of coloring material, a green resist for forming the green filter is lower in refractive index after the curing thereof as compared with a red resist and a blue resist to be employed for forming the red filter and the blue filter, respectively. Namely, since the color resist to be employed in the photolithography process is required to be excellent in photosensitivity, it is difficult to select one which is also high in refractive index after the curing thereof, thus creating a discrepancy in refractive index among these three different color filters. Because of this discrepancy, the light converging effect by the micro-lens is also caused to differ among these color filters, thus raising a problem that non-uniformity of reflectance is caused to be generated among these color filters.

As described above, the color filter to be created by means of the conventional photolithography process is accompanied with various problems that it is impossible to secure sufficient resolution, that residues of color filter tends to remain unremoved, that the peeling of pixel is more likely to occur, and that the characteristics of the solid state image pickup device may be deteriorated. Additionally, there are also problems that not only the distance between the color filter and the photoelectric conversion element but also the distance between the micro-lens and the photoelectric conversion element (under-lens distance) is caused to become large.

BRIEF SUMMARY OF THE INVENTION

An object of the present invention is to provide a solid state image pickup device having a color filter which can be formed without generating malformation of pattern, without leaving the residue of pattern, and without generating the peeling of pattern, which can be formed close to the photoelectric conversion element, and which is free from non-uniformity in reflectance among the pixels.

Another object of the present invention is to provide a method of manufacturing such a solid state image pickup device as described above.

According to a first aspect of the present invention, there is provided a method of manufacturing a solid state image pickup device comprising photoelectric conversion elements which are two-dimensionally arranged in a semiconductor substrate, and a color filter including a plurality of color filter patterns differing in color from each other and disposed on a surface of the semiconductor substrate according to the photoelectric conversion elements; the method comprising successively subjecting a plurality of filter layers differing in color from each other to a patterning process to form said plurality of color filter patterns; wherein at least one color filter pattern to be formed at first among said plurality of color filter patterns is formed by means of dry etching; and the rest of said plurality of the color filter pattern is formed by means of photolithography.

According to a second aspect of the present invention, there is provided a method of manufacturing a solid state image pickup device comprising photoelectric conversion elements which are two-dimensionally arranged in a semiconductor substrate, a color filter including a plurality of color filter patterns differing in color from each other and disposed on a surface of the semiconductor substrate according to the photoelectric conversion elements, and a flattening layer formed entirely or partially on the surface of the semiconductor substrate; the method comprising successively subjecting a plurality of filter layers differing in color from each other to a patterning process to form said plurality of color filter patterns; wherein at least one color filter pattern to be formed at first among said plurality of color filter patterns is formed by dry-etching an unnecessary portion of one of the filter layers and a portion of the flattening layer which is formed below the unnecessary portion; and the rest of said plurality of color filter pattern is formed by means of photolithography.

According to a third aspect of the present invention, there is provided a solid state image pickup device comprising: photoelectric conversion elements which are two-dimensionally arranged in a semiconductor substrate; and a color filter including a plurality of color filter patterns differing in color from each other and disposed on a surface of the semiconductor substrate according to the photoelectric conversion elements; wherein said plurality of color filter patterns comprise one color filter pattern containing a thermally cured resin, and the rest of said plurality of color filter patterns containing a photo-cured resin.

According to a fourth aspect of the present invention, there is provided a solid state image pickup device comprising: photoelectric conversion elements which are two-dimensionally arranged in a semiconductor substrate; and a color filter including a plurality of color filter patterns differing in color from each other and disposed on a surface of the semiconductor substrate according to the photoelectric conversion elements; wherein one of the color filter patterns which is the largest in area among said plurality of color filter patterns contains a thermally cured resin, the rest of said plurality of color filter patterns containing a photo-cured resin.

According to a fifth aspect of the present invention, there is provided a solid state image pickup device comprising: photoelectric conversion elements which are two-dimensionally arranged in a semiconductor substrate; a color filter including a plurality of color filter patterns differing in color from each other and disposed on a surface of the semiconductor substrate according to the photoelectric conversion elements; and a flattening layer formed entirely or partially on the surface of the semiconductor substrate; wherein the flattening layer formed below said plurality of color filter patterns is composed of two portions differing in thickness from each other, one portion being disposed below one of said plurality of color filter patterns and the other portion being disposed below the rest of said plurality of color filter patterns.

According to a sixth aspect of the present invention, there is provided a solid state image pickup device comprising: photoelectric conversion elements which are two-dimensionally arranged in a semiconductor substrate; a color filter including a plurality of color filter patterns differing in color from each other and disposed on a surface of the semiconductor substrate according to the photoelectric conversion elements; and a flattening layer formed entirely or partially on the surface of the semiconductor substrate; wherein the color filter is constituted by one filter pattern which is formed on the flattening layer and another filter pattern which is formed directly on the semiconductor substrate.

According to a seventh aspect of the present invention, there is provided a solid state image pickup device comprising: photoelectric conversion elements which are two-dimensionally arranged in a semiconductor substrate; a color filter including a plurality of color filter patterns differing in color from each other and disposed on a surface of the semiconductor substrate according to the photoelectric conversion elements; and a flattening layer formed entirely or partially on the surface of the semiconductor substrate; wherein said plurality of color filter patterns include one color filter pattern containing a thermally cured resin, the rest of said plurality of color filter patterns containing a photo-cured resin.

BRIEF DESCRIPTION OF THE SEVERAL VIEWS OF THE DRAWING

FIG. 1A is a cross-sectional view illustrating a process of patterning by means of dry etching to be employed in the present invention;

FIG. 1B is a cross-sectional view illustrating a process of patterning by means of dry etching to be employed in the present invention;

FIG. 1C is a cross-sectional view illustrating a process of patterning by means of dry etching to be employed in the present invention;

FIG. 1D is a cross-sectional view illustrating a process of patterning by means of dry etching to be employed in the present invention;

FIG. 1E is a cross-sectional view illustrating a process of patterning by means of dry etching to be employed in the present invention;

FIG. 2A is a cross-sectional view illustrating a process of patterning by means of photolithography to be employed in the present invention;

FIG. 2B is a cross-sectional view illustrating a process of patterning by means of photolithography to be employed in the present invention;

FIG. 2C is a cross-sectional view illustrating a process of patterning by means of photolithography to be employed in the present invention;

FIG. 3 is a cross-sectional view illustrating part of the solid state image pickup device that has been obtained by a manufacturing method according to one embodiment of the present invention;

DETAILED DESCRIPTION OF THE INVENTION

Figure 4A:
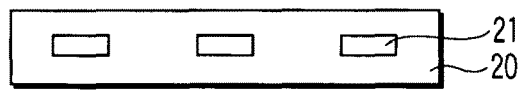
FIG. 4A is a cross-sectional view illustrating in step-wise the manufacturing method of a solid state image pickup device according to one embodiment of the present invention.

Next, best mode for carrying out the present invention will be explained.

A method of manufacturing a solid state image pickup device according to a first aspect of the present invention is featured in that at least one color filter pattern to be formed at first among a plurality of color filter patterns is formed by means of dry etching and the rest of the plurality of the color filter pattern(s) is (are) formed by means of photolithography.

Since it is impossible to secure sufficient adhesion between a photoresist and a semiconductor substrate, when a filter pattern is formed directly on the surface of a semiconductor substrate by means of photolithography, there will be raised a problem that the photoresist is caused to peel off on the occasion of developing step. Whereas, in the case of dry etching, a resinous resin used for manufacturing semiconductor chips to be employed as a color filter can be freely selected from those which are higher in resolution than the color resist and excellent in adhesion to the semiconductor substrate. Therefore, it is possible to create, as a first pattern, a fine and smooth filter pattern without leaving the residue thereof and without generating the peeling of pattern on the occasion of patterning step.

If the filter patterns of the rest of colors including the second color are subsequently formed by means of dry etching, the surface of the filter pattern that has been once formed may be roughened unless any suitable means is provided for protecting the surface of the filter pattern formed in advance, thus raising a problem. Further, there is also a problem that a color filter layer to be subsequently formed may be badly affected by the roughened surface of the filter pattern that has been formed in advance.

In view of these problems, at least a first color filter pattern is formed by means of dry etching and the rest of the color filter pattern(s) is (are) formed by means of photolithography. More specifically, a first color filter pattern is formed by means of dry etching and the color filter patterns of the rest of colors including the second color are formed by means of photolithography.

By taking these measures, it is now possible, without necessitating any special protection for the surface of the filter pattern of the first color, to prevent the surface of the filter pattern of the first color from being roughened in the step of patterning the rest of the color filters including the second color filter by means of photolithography. Further, since the rest of filter patterns after the second color filter pattern can be firmly sustained by the filter pattern of the first color that has been strongly adhered to an underlying layer, it is possible to prevent the rest of filter patterns from being peeled on the occasion of the developing step thereof. Namely, since the filter pattern that has been formed by means of dry etching is enabled to act as an anchor, it is possible to prevent the filter patterns that have been formed by means of photolithography from being cut out.

Additionally, since the accuracy of the filter pattern that has been formed at first has a great influence on the accuracy of the color filter as a whole, when at least the filter pattern to be formed at first is formed by making use of dry etching, it is possible to enhance the accuracy of the color filter as a whole, thus making it possible to obtain a solid state image pickup device which is free from color uneven and provided with a large number of pixels.

As described above, according to the first aspect of the present invention, since at least the first pattern-forming step for forming a pattern of color filter layer is performed by means of dry etching, the resist used for manufacturing semiconductor chips to be employed as a mask can be freely selected from those which are capable of achieving very fine patterning. Accordingly, it is possible to create a color filter having a fine pattern excellent in configuration without leaving the residue thereof and without generating the peeling of pixel. Namely, according to this method, since a color filter layer that has been thermally cured is dry-etched, thereby making it possible, in the beginning, to form a predetermined filter pattern which is excellent in adhesion to a substrate, even if the next filter pattern is subsequently formed adjacent to the first filter pattern, it is possible to prevent this neighboring next filter pattern from being peeled off owing to the existence of the first filter pattern formed at first and excellent in adhesion. Moreover, since the filter pattern that has been formed at first is completely cured, it cannot be peeled off in a developing process to be subsequently performed by means of photolithography.

A method of manufacturing a solid state image pickup device according to a second aspect of the present invention is featured in that at least one color filter pattern to be formed at first among a plurality of color filter patterns is formed by dry-etching an unnecessary portion of one of the filter layers and a portion of the flattening layer which is formed below said unnecessary portion, and that the rest of the plurality of color filter pattern(s) is (are) formed by means of photolithography.

As described above, according to the second aspect of the present invention, since at least one color filter pattern to be formed at first among a plurality of color filter patterns is formed by dry-etching, it is possible to obtain almost the same effects as described above in the method of manufacturing a solid state image pickup device according to the first aspect of the present invention.

Incidentally, the filter patterns are generally configured such that, since the spectral characteristics desired of each of the color filter patterns differ depending on the kind of color and also since the kinds of resin and pigment to be employed in these color filter patterns differ depending on the kind of color, the thickness of each of these filter patterns is caused to differ from the others. Further, since the filter pattern to be formed by means of dry etching is not required to be photosensitive, the concentration of pigment in the filter pattern can be increased. As a result, this filter pattern may be formed thinner as compared with other filter patterns to be formed by means of photolithography.

Accordingly, by allowing the flattening layer to be dry-etched on the occasion of dry-etching the first filter pattern, it is possible to minimize a difference in thickness among these filter patterns, especially a difference in thickness between the filter pattern to be formed by means of dry etching and the filter pattern to be formed by means of photolithography. As a result, it is now possible to provide a solid state image pickup device provided with a color filter having a surface which is minimal in step portion between neighboring color filter patterns and also very small in distance between the color filter and the photoelectric conversion element.

As described above, according to the second aspect of the present invention, it is possible to provide a method of manufacturing a solid state image pickup device provided with a color filter which is excellent in fineness, free from the residue and chipping of filter patterns, excellent in smoothness of edge portion, minimal in step portion between neighboring color filter patterns and also very small in distance between the color filter and the photoelectric conversion element.

In the method of manufacturing a solid state image pickup device according to the second aspect of the present invention, the step of dry-etching one of the filter layers may be performed in such a manner that a portion of the flattening layer which is formed below an unnecessary portion is not completely etched away leaving therein the flattening layer having a reduced thickness, whereby the flattening layer existing below the aforementioned one of the color filter layers is made to have a different thickness from that of the flattening layer existing below the rest of color filter patterns.

Further, the step of dry-etching one of the filter layers may be performed in such an extent that the unnecessary portion as well as a portion of the flattening layer which is formed below the unnecessary portion is completely etched away, exposing the surface of semiconductor substrate.

Due to the roughened surface of the flattening layer that may be generated in the step of dry etching, it is more likely that the residues of filter pattern resists of other colors to be deposited after the dry etching are allowed to leave behind. There are many possibilities that these residues may badly affect the quality of picture, generating noise or defects as the distance between the filter pattern and the photoelectric conversion element becomes smaller. Therefore, the existence of these residues is not desirable. The generation of these residues can be prevented by completely eliminating the flattening layer and then depositing the filter patterns directly on the surface of the semiconductor substrate by means of photolithography. More specifically, the etching is continued until the flattening layer can be completely removed on the occasion of the dry etching, thus leaving no flattening layer below the filter patterns to be subsequently formed by means of photolithography.

In the method of manufacturing a solid state image pickup device according to the first and the second aspects of the present invention, one of the color filter patterns which is the largest in area among the plurality of color filter patterns may be formed by means of dry etching.

When a filter pattern which is the largest in area among the plurality of filter patterns is created by means of dry etching, the rest of filter patterns to be created by means of photolithography can be effectively sustained. Additionally, the accuracy of the filter pattern which is the largest in area among the plurality of filter patterns has great influence on the accuracy of the color filter as a whole.

Furthermore, when these filter patterns are constructed as a multi-layer structure, it would be effective to apply dry etching to a lower filter pattern (which is disposed close to the semiconductor substrate).

Additionally, it may be preferable that the color filter layer to be patterned by means of dry etching contains at least a thermosetting resin, and the color filter layer to be patterned by means of photolithography contains at least a photo-setting resin.

Since the filter pattern containing a thermosetting resin and formed into a predetermined pattern by means of dry etching is enabled to firmly adhere to the semiconductor substrate or the flattening layer, there is little possibility that the filter pattern is caused to peel off. Further, in the case of the color filter layer containing a thermosetting resin, it is possible to increase the concentration of coloring material contained therein, thus making it possible to make thinner the color filter, to prevent the mixing of colors that may be caused by the incident light and to reduce the thickness of the solid state image pickup device.

The solid state image pickup device according to the third aspect of the present invention is featured in that a plurality of color filter patterns comprise one color filter pattern containing a thermally cured resin, and the rest of the plurality of color filter patterns containing a photo-cured resin.

In the case of the solid state image pickup device constructed as described above, since the color filter comprises a color filter pattern containing a thermally cured resin, it is possible to secure excellent adhesion between the color filter and the semiconductor substrate without necessitating the interposition of the flattening layer, thereby making it possible to deposit the color filter directly on the surface of the semiconductor substrate without any deposition in advance of the flattening layer. As a result, it is possible to obtain a solid state image pickup device which is very small in under-lens distance. Especially, since a thermosetting resin is employed, it is possible to increase the concentration of a coloring material in the solid matter, thus making it possible to reduce the thickness of the color filter and hence to prevent the mixing of colors that may be caused by the incident light. Because of these reasons also, it is possible to obtain a solid state image pickup device wherein the distance between the color filter and the photoelectric conversion element is very small, and the under-micro-lens distance is also very small, thus enabling it to exhibit excellent sensitivity. Additionally, the problem of color uneven that may be caused by the configuration of the edge of pattern of color filter can be overcome.

The aforementioned plurality of color filter patterns may include a green filter pattern which contains a resin exhibiting a higher refractive index than that of resins contained in the rest of color filter patterns. In this way, the refractive indexes of the plurality of color filter patterns can be made nearly the same with each other. As a result, the light converging effect by the micro-lens can be made identical with other, thus making it possible to obtain an excellent solid state image pickup device.

Further, since a resin which is relatively high in refractive index tends to indicate a smaller etching rate, to perform the patterning of a layer containing a resin exhibiting a high refractive index by means of dry etching is effective in obtaining a filter pattern having a smooth surface.

Furthermore, a flattening layer may be formed on the color filter so as to eliminate the projected/recessed portions on the surface of the color filter and then micro-lens may be formed on this flattening layer.

In addition to the formation of the micro-lens on the color filter, a peripheral portion of the micro-lens, or a lower portion of the micro-lens may be constituted by part of the color filter, i.e., an upper portion of the color filter. By constructing the micro-lens in this manner, the under-micro-lens distance can be decreased, thus making it possible to obtain a solid state image pickup device which is excellent in sensitivity.

The solid state image pickup device according to the fourth aspect of the present invention is featured in that one of the color filter patterns which is the largest in area among a plurality of color filter patterns contains a thermally cured resin, and the rest of the plurality of color filter patterns contains a photo-cured resin.

In the case of the solid state image pickup device constructed as described above, since a color filter pattern having a largest area among a plurality of color filter patterns contains a thermally cured resin, it is possible to secure excellent adhesion between the color filter pattern and the semiconductor substrate. Further, since the flattening layer can be dispensed with, it is possible to obtain a solid state image pickup device which is very small in under-lens distance. Especially, since a thermosetting resin is employed, it is possible to increase the concentration of a coloring material in the solid matter, thus making it possible to reduce the thickness of the color filter and hence to prevent the mixing of colors that may be caused by the incident light. Because of these reasons also, it is possible to obtain a solid state image pickup device wherein the distance between the color filter and the photoelectric conversion element is very small, and the under-micro-lens distance is also very small, thus enabling it to exhibit excellent sensitivity. Additionally, the problem of color uneven that may be caused by the configuration of the edge of pattern of color filter can be overcome.

When a filter pattern is formed directly on the surface of semiconductor substrate by making use of a photo-setting resin (photoresist), there will be raised a problem that the filter pattern is caused to peel off on the occasion of developing process since the photoresist fails to have sufficient adhesion to the semiconductor substrate. Whereas, in the case of the solid state image pickup device according to the third and the fourth aspects of the present invention, since the thermally cured filter pattern is enabled to act as an anchor, the photo-cured filter pattern that has been formed adjacent to the thermally cured filter pattern can be prevented from being cut out. Therefore, it is possible to form a color filter directly on the surface of semiconductor substrate without necessitating the provision of the flattening layer. Accordingly, it is possible to minimize the distance between the color filter and the photoelectric conversion element as well as the distance between the micro-lens and the photoelectric conversion element (under-lens distance).

The solid state image pickup device according to the fifth aspect of the present invention is featured in that the flattening layer formed below a plurality of color filter patterns is composed of two kinds of layers differing in thickness from each other, one of which is disposed below one of the plurality of color filter patterns and the other being disposed below the rest of the plurality of color filter patterns.

In the case of the solid state image pickup device constructed as described above, since any difference in thickness between the filter patterns can be absorbed by the flattening layer, it is possible to provide a solid state image pickup device provided with color filters having a uniform flat surface.

In the case of the solid state image pickup device constructed as described above, the aforementioned plurality of color filter patterns may include a green filter pattern which contains a resin exhibiting a higher refractive index than that of resins contained in the rest of the color filter patterns.

By setting the refractive index of the resin to be contained in the green filter pattern higher than the refractive index of the resin contained in the rest of the color filter patterns, the refractive indexes among the filter patterns can be made nearly the same with each other. As a result, it is possible to obtain an excellent solid state image pickup device where the light converging effect by the micro-lens on each of the color filters can be made identical to other.

Further, since a resin which is relatively high in refractive index tends to indicate a smaller etching rate, the technique of performing the patterning of a layer containing a resin exhibiting a refractive index by means of dry etching is effective in obtaining a filter pattern having a smooth surface.

Further, the solid state image pickup device may further comprise micro-lenses disposed directly or indirectly over the color filters and according to the photoelectric conversion elements, the peripheral portion (a lower portion) of the micro-lens being constituted by a portion (an upper portion) of the color filters.

As described above, since a peripheral portion of the micro-lens is constituted by part of the color filter, it is possible to obtain a solid state image pickup device where the under-micro-lens distance is relatively small.

The solid state image pickup device according to the sixth aspect of the present invention is featured in that the color filter is constituted by one kind of filter pattern which is formed, via the flattening layer, on the semiconductor substrate and another kind of filter pattern which is formed directly on the semiconductor substrate.

In the case of the solid state image pickup device constructed as described above, since any difference in thickness between the filter patterns can be absorbed by the flattening layer, it is possible to provide a solid state image pickup device which is provided with color filters having a uniform flat surface and wherein the flattening layer is disposed at only the least limited portions which necessitate the provision of the flattening layer, thus minimizing the distance between the color filter and the photoelectric conversion element.

The solid state image pickup device according to the seventh aspect of the present invention is featured in that a plurality of color filter patterns comprise one color filter pattern containing a thermally cured resin, and the rest of the plurality of color filter patterns containing a photo-cured resin.

In the case of the solid state image pickup device constructed as described above, since the filter pattern containing a thermosetting resin is enabled to firmly adhere to the semiconductor substrate or the flattening layer, there is little possibility that the filter pattern is caused to peel off. Further, in the case of the color filter layer containing a thermosetting resin, it is possible to increase the concentration of coloring material contained therein, thus making it possible to make thinner the color filter, to prevent the mixing of colors that may be caused by the incident light and to reduce the thickness of the solid state image pickup device.

Next, various specific embodiments of the present invention will be explained on the basis of aforementioned various aspects of the present invention.

First of all, a couple of processes for forming a filter pattern, which can be employed in the present invention, will be explained.

A process for performing the patterning by means of dry etching which will be employed in the present invention can be carried out in such a manner that a pattern of resin having a configuration of an object is formed on the surface of an object-forming layer, and the object-forming layer is dry-etched with this resin pattern being employed as a mask, thereby transcribing this configuration of the object to the object-forming layer. More specifically, as shown in FIGS. 1A to 1E, a color filter layer 32 is formed as an object-forming layer on the surface of a substrate 31 (FIG. 1A), a photosensitive resin layer 33 is formed on the color filter layer 32 (FIG. 1B), this photosensitive resin layer 33 is then patterned to form a resin pattern 34 having a configuration of an object (FIG. 1C), and the configuration of this resin pattern 34 is transcribed onto the color filter layer 32 by dry etching with the resin pattern 34 being employed as a mask (FIG. 1D), thus finally forming a filter pattern 35 having the configuration of the object (FIG. 1E).

A process for performing the patterning by means of photolithography which will be employed in the present invention can be carried out in such a manner that a photosensitive object-forming layer is formed at first and then subjected to a patterning exposure to selectively photo-cure the object-forming layer through a mask, and then the resultant object-forming layer is subjected to a developing process, thereby removing an unnecessary portion of the object-forming layer to obtain a patterned object. More specifically, as shown in FIGS. 2A to 2C, a color filter layer 42 is formed as an object-forming layer by making use of a photosensitive resin composition (FIG. 2A) and then subjected to a patterning exposure to selectively photo-cure the color filter layer 42 through a mask (not shown) to selectively cure the object-forming layer (FIG. 2B), and then an unnecessary portion 42b is removed by making use of a developing solution to leave photo-cured portions 42a, which is followed, if necessary, by heat curing, thus forming a filter pattern 43, i.e., the object (FIG. 2C).

FIG. 3 is a cross-sectional view illustrating part of the solid state image pickup device according to one embodiment of the present invention. FIGS. 4A-4G are cross-sectional views each illustrating in step-wise the manufacturing method of a solid state image pickup device shown in FIG. 3. FIG. 5 is a plan view of the solid state image pickup device shown in FIG. 3.

As shown in FIG. 3, the solid state image pickup device according to one embodiment of the present invention is constituted by a color filter 12 for color-separating an incident light which is formed on the surface of a semiconductor substrate 10 provided therein with photoelectric conversion elements 11 which are arranged two-dimensionally and capable of converting the light into electrical signals; a flattening layer 13 employed for flattening the surface of the color filter 12; and a plurality of micro-lenses 14 disposed on this flattening layer 13. This flattening layer 13 may be omitted under some circumstances.

This solid state image pickup device can be manufactured according to the method shown in FIGS. 4A-4G.

Figure 4B:
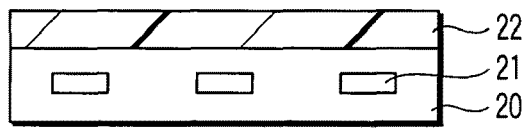
FIG. 4B is a cross-sectional view illustrating in step-wise the manufacturing method of a solid state image pickup device according to one embodiment of the present invention.
Figure 5:
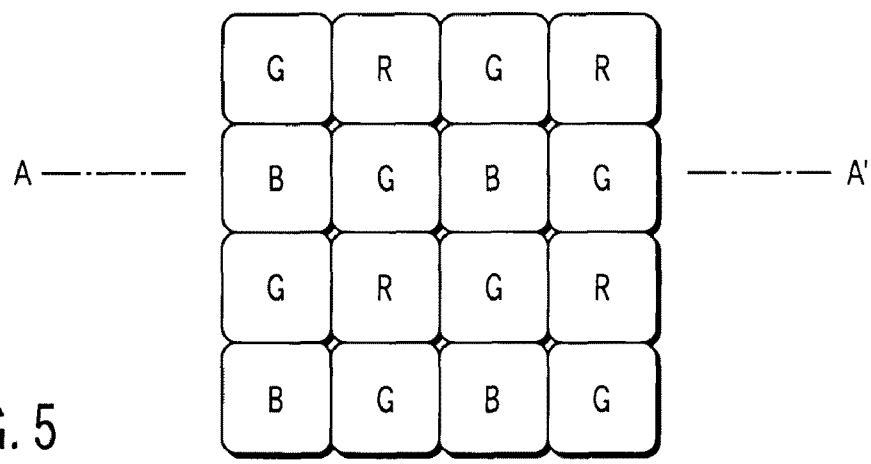
FIG. 5 is a plan view illustrating part of the solid state image pickup device shown in FIG. 3.

First of all, as shown in FIG. 4B, a first color resist layer 22 is formed on the surface of a semiconductor substrate 20 provided with photoelectric conversion elements 21 which are two-dimensionally arranged thereon (see FIG. 4A). This first color resist layer 22 can be formed as follows. Namely, a first resin dispersion comprising, as a major component, a thermosetting resin, and a pigment is coated on the surface of the semiconductor substrate 20 and then thermally cured to form the first color resist layer 22.

Figure 4C:
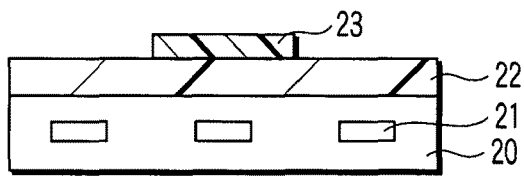
FIG. 4C is a cross-sectional view illustrating in step-wise the manufacturing method of a solid state image pickup device according to one embodiment of the present invention.

Then, as shown in FIG. 4C, by means of photolithography for example, a prescribed resin pattern 23 is formed on this first color resist layer 22. As for the material for the resin pattern 23, it is possible to employ a photosensitive resin such as acrylic resin, epoxy resin, polyimide resin, phenol novolac resin. These resins can be employed singly or as a combination thereof or as a copolymer thereof. As for the light exposure apparatus to be employed in the photolithography process for patterning the photosensitive resin, there are known various kinds of apparatuses such as a stepper, an aligner, a mirror projection aligner. However, the stepper is generally employed for the formation of color filter of the solid state image pickup device where a large number of pixels and an increased fineness are required.

Figure 4D:
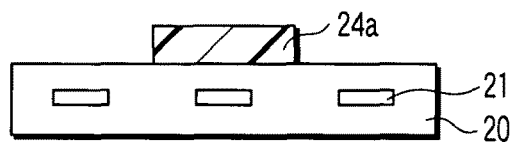
FIG. 4D is a cross-sectional view illustrating in step-wise the manufacturing method of a solid state image pickup device according to one embodiment of the present invention.

Then, as shown in FIG. 4D, by making use of the resin pattern 23 as a mask, the first color resist layer 22 is patterned by means of dry etching to form a first filter pattern 24a. As for the method of dry etching, it is possible to employ, for example, ECR, a parallel plate magnetron, DRM, ICP, double-frequency type RIE, etc.

The gas to be employed in the dry etching may be a reactive (oxidizing or reductive) gas, i.e., a gas having etching properties. For example, it is possible to employ, though is not limited to, a gas containing, in its molecule, a halogen such as fluorine, chlorine, bromine, etc.; or a gas containing, in its molecule, an oxygen or sulfur atom.

Figure 4E:
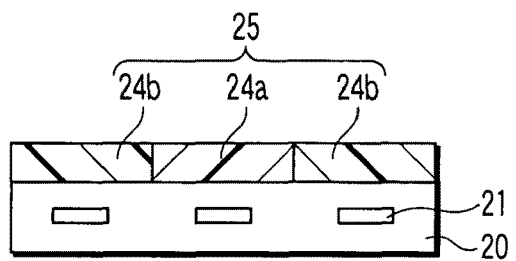
FIG. 4E is a cross-sectional view illustrating in step-wise the manufacturing method of a solid state image pickup device according to one embodiment of the present invention.

Subsequently, a second color resist layer is deposited all over the surface and then patterned in the same manner as in the case of the first filter pattern 24a by means of dry etching or photolithography to form a second filter pattern 24b as shown in FIG. 4E.

Then, a third color resist layer is deposited all over the surface and then patterned by means of photolithography to form a third filter pattern (not shown), thereby fabricating a color filter 25 comprising the first, the second and the third filter patterns.

FIG. 5 illustrates the arrangement of each of the filter patterns of the color filter 25. The arrangement shown in FIG. 5 is a so-called Bayer arrangement wherein a green (G) filter is disposed at every second pixel, whereas both a red (R) filter and a blue (B) filter are disposed between a couple of G filters and at every second line. FIG. 3 is a cross-sectional view taken along the line A-A' of FIG. 5.

Figure 4F:
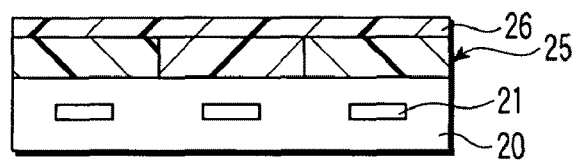
FIG. 4F is a cross-sectional view illustrating in step-wise the manufacturing method of a solid state image pickup device according to one embodiment of the present invention.

Then, as shown in FIG. 4F, a flattening layer 26 is deposited on the color filter 25 which has been fabricated as described above. As for the material for the flattening layer, it is possible to employ acrylic resin, epoxy resin, polyimide resin, phenol novolac resin, polyester resin, urethane resin, melamine resin, styrene resin, etc. These resins can be employed singly or in combination of two or more kinds thereof. Incidentally, this flattening layer 26 may not necessarily be provided.

Figure 4G:
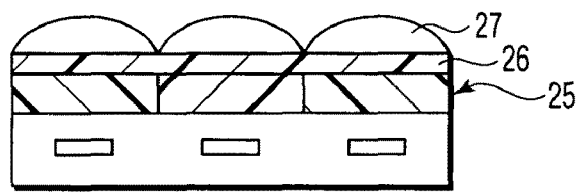
FIG. 4G is a cross-sectional view illustrating in step-wise the manufacturing method of a solid state image pickup device according to one embodiment of the present invention.

Finally, as shown in FIG. 4G, micro-lenses 27 are formed on the flattening layer 26 by means of thermal reflow method which is conventionally known, thereby accomplishing the manufacture of the solid state image pickup device.

According to the manufacturing method of the solid state image pickup device as described above, since the first filter pattern 24a is formed by way of the patterning using dry etching after the first color resist layer 22 has been completely thermally cured, the adhesion of the first filter pattern 24a to the semiconductor substrate 20 is very strong. Due to the provision of the first filter pattern 24a which is excellent in adhesion as described above, even if the second and the third filter patterns are formed by means of photolithography, these second and third filter patterns can be firmly sustained by the first filter pattern 24a which has been placed adjacent to them, thereby making it possible to improve the adhesion of the color filter 25 as a whole. Therefore, these filter patterns can be formed directly on the surface of the semiconductor substrate 20 without necessitating the interposition of the flattening layer.

In this case, the first filter pattern 24a should preferably be constituted by a filter pattern having the largest area among a plurality of filter patterns. In this way, it is possible to further enhance the adhesion of the color filter to the semiconductor substrate. The size of the area of the filter pattern having the largest area may be 1-2 times as large as that of the filter pattern having the smallest area among a plurality of filter patterns. Additionally, since the filter pattern having the largest area has been patterned by means of dry etching, it is possible to more accurately perform the patterning of the filter pattern having the largest area, thereby making it possible to enhance the accuracy of the color filter as a whole. More specifically, the green filter pattern is more likely to be selected as having the largest area.

Further, when a color filter having a higher concentration of pigment, i.e., a color filter having a lower content of a resin having much to do with the curing of the color filter is patterned by means of dry etching, even the color filter layer which cannot be sufficiently cured in the ordinary photolithography can be patterned accurately without leaving the residue thereof and without generating the peeling thereof. When a color filter having a high concentration of a pigment is patterned by means of photolithography, the shape of edge of the filter pattern tends to become defective, thus giving rise to the generation of uneven image. However, when such a color filter is patterned by means of dry etching, it is possible to form the filter pattern which is excellent in configuration of edge, thus obviating the generation of an uneven image. More specifically, these effects would be more prominently manifested when the dry etching is applied to the formation of a red filter pattern or a green filter pattern.

When the size of a color filter is very small (especially, when the size is not more than 2.5 μm), the color filter should preferably be patterned by means of dry etching. Namely, when the ordinary photolithography is applied to the patterning of a color filter of such a very small size, the shape of edge of the filter pattern tends to become defective, thus giving rise to the generation of uneven image. However, when such a color filter is patterned by means of dry etching, it is possible to form the filter pattern which is excellent in configuration of edge. Incidentally, when the first color filter is formed to have an excellent configuration, the configuration of the rest of color filters including the second color filter can be improved and the peeling thereof can be also prevented.

Additionally, the patterning by means of dry etching is also useful in the patterning of such a kind of color filter that exhibits a low transmissivity to the exposure wavelength to be employed in the patterning by means of photolithography, resulting in insufficient exposure and hence leading to the deterioration of resolution and the generation of peeling. Namely, by making use of the dry etching, even the color filter layer which cannot be sufficiently cured in the ordinary photolithography can be patterned accurately without leaving the residue thereof and without generating the peeling thereof. Especially, these effects would be more prominently manifested when the dry etching is applied to the formation of a blue filter pattern.

Irrespective of the reasons, when the first filter pattern is formed by means of dry etching, it is possible to obtain a filter pattern which is excellent in resolution, capable of strongly adhering to the underlying substrate, and free from residues and peeling. Thereafter, the photolithography which is small in the number of steps and excellent in efficiency can be employed for the patterning for the rest of filter layers. As a result, it is possible, due to the filter pattern that has been formed at first with high accuracy and enabled to strongly adhere to the substrate, to form the rest of filter layers accurately and without generating the peeling thereof even if they are patterned by means of photolithography.

When a color filter is to be formed by means of photolithography, a stepper apparatus using an exposure light having a wavelength of 365 nm can be employed. In the case of the blue filter, since the exposure light having a wavelength of 365 nm is incapable of penetrating into the bottom portion of the filter, a bottom portion of the blue color sensitive resin cannot be sufficiently cured, thereby permitting the blue filter to be easily peeled as compared with the filters of other colors.

In the present invention however, since a pattern (especially, a green pattern) which is excellent in configuration and adhesion is formed first, if a subsequently formed pattern is poor in adhesion, such as a blue filter pattern formed by means of photolithography, it is possible to prevent the peeling and defective configuration of the blue filter pattern as the blue filter pattern is sustained by the green pattern. The arrangement of colors of the solid state image pickup device is generally based on the Bayer arrangement wherein one unit cell is constituted by four pixels, i.e., two green pixels, one blue pixel and one red pixel. Therefore, when the green filter is formed by means of dry etching, the other two color filter can be supported by the green filter, thereby improving the configuration and adhesion of the other two color filters.

Various kinds of green patterns varying in pixel size were formed, directly or through a flattening layer, on a test pattern substrate by means of photolithography or by means of dry etching to evaluate the adhesion and the generation of peeling in these green patterns. The results are summarized in the following Table 1.

Incidentally, the criterion for evaluation was as follows.

TABLE 1

| | | Evaluation on adhesion | | | | |
|---|---|---|---|---|---|---|
| CF-forming method | Underlying layer | Pixel size (μm) | | | | |
| | | 1.0 | 1.5 | 2.0 | 2.5 | 3.0 |
| Photolithography | Direct to substrate | X | X | X | X | X |
| | Flattening layer | X | Δ | ○ | ○ | ○ |
| Dry etching | Direct to substrate | ○ | ○ | ○ | ○ | ○ |
| | Flattening layer | ○ | ○ | ○ | ○ | ○ |

○: Peeling was not recognized
Δ: Peeling was recognized more or less
X: Pixel was not adhered It will be recognized from Table 1 that in the case where the green pattern was formed directly on the substrate by means of photolithography, the green patterns of any pixel size were found incapable of satisfactorily adhering to the substrate. Even if the green pattern was formed, through the flattening layer, on the substrate by means of photolithography, the green patterns having a size of not less than 2.0 μm were found capable of satisfactorily adhering to the substrate and the green pattern having a size of 1.5 μm was found incapable of preventing the peeling thereof from the substrate. Whereas, in the case of the dry etching method, it was found successful in preventing the peeling of every green patterns irrespective of manner of deposition, i.e., deposition directly on the surface of the substrate or deposition with the interposition of the flattening layer, and even the green pattern having a pixel size of 1.0 μm was found successful in preventing the peeling thereof.

It will be recognized from these results that when the filter pattern of the first color is formed by means of etching and then the filter patterns of the rest of colors including the second color are formed by means of photolithography, it is possible to obtain a color filter which is excellent in adhesion as a whole, since the filter patterns of the rest of colors can be sustained by the filter pattern of the first color which is excellent in adhesion.

Figure 10:
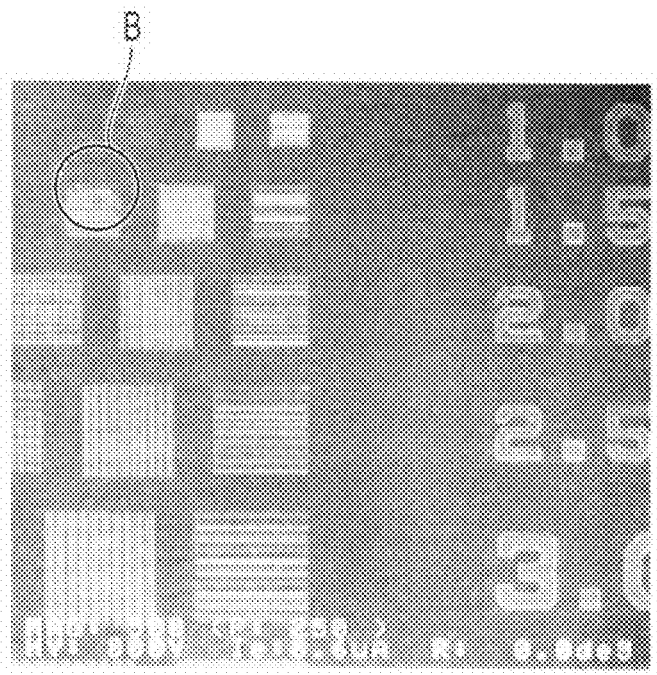
FIG. 10 is a microphotograph illustrating green patterns of various pixel sizes which have been formed, via a flattening layer, on the surface of a test pattern substrate.
Figure 11:
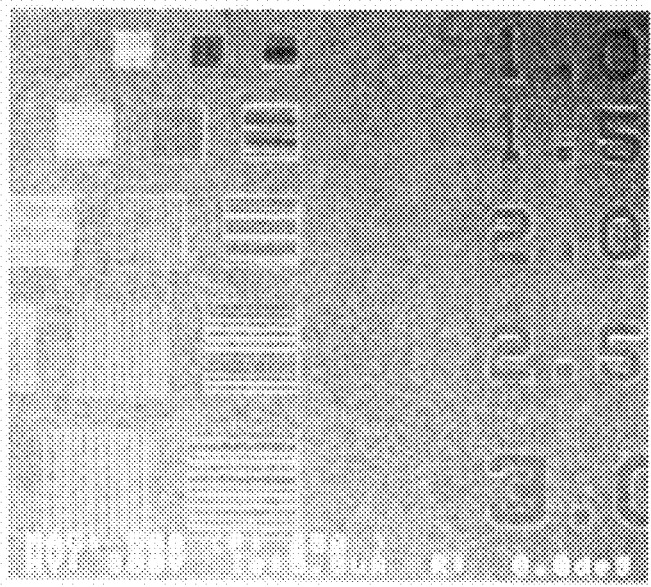
FIG. 11 is a microphotograph illustrating green patterns of various pixel sizes which have been formed, via a flattening layer, on the surface of a test pattern substrate.

Incidentally, FIGS. 10 and 11 show respectively a microscopic photograph illustrating green patterns of various pixel sizes which were formed, via a flattening layer, on the surface of a test pattern substrate. FIG. 10 shows a microscopic photograph of patterns formed by means of photolithography and FIG. 11 shows a microscopic photograph of patterns formed by means of etching method. As shown by the mark "B" in FIG. 10, when photolithography was employed, the peeling of pixels was caused to be generated at a pixel size of 1.5 μm. Whereas, when etching method was employed, the peeling of pixels was not caused to be generated even the pixel size was reduced to as small as 1.0 μm as shown in FIG. 11.

Figure 12:
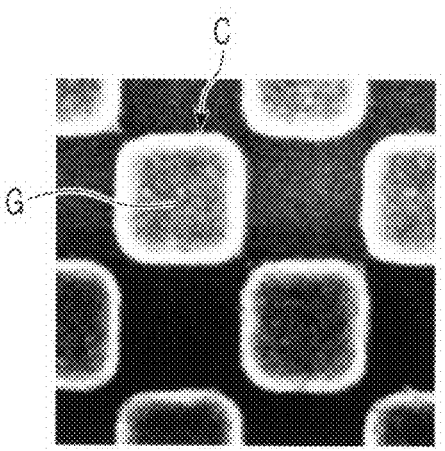
FIG. 12 is a microphotograph illustrating a green pattern 1.5 μm in pixel size that has been formed by means of photolithography on the surface of a glass substrate.
Figure 13:
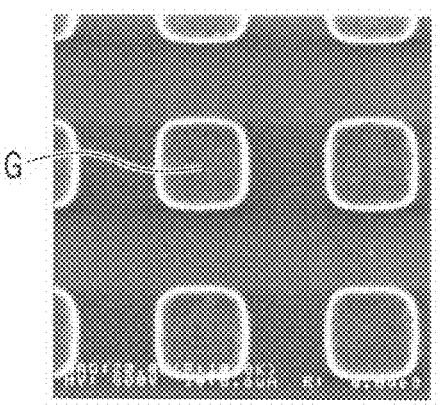
FIG. 13 is a microphotograph illustrating a green pattern 2.0 μm in pixel size that has been formed by means of photolithography on the surface of a glass substrate.
Figure 14:
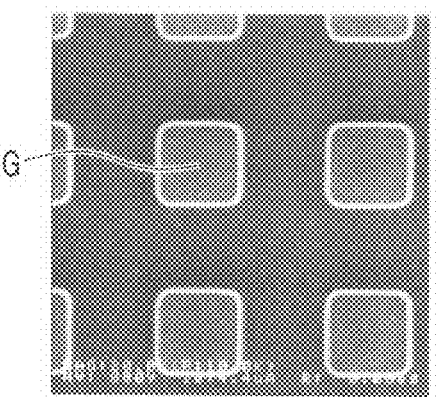
FIG. 14 is a microphotograph illustrating a green pattern 2.0 μm in pixel size that has been formed by means of dry etching on the surface of a glass substrate.

Next, rectangular green patterns were formed on a glass substrate by means of photolithography and dry-etching method to assess the configurations thereof. FIGS. 12 and 13 both show microscopic photographs of green patterns having a pixel size of 1.5 μm and a pixel size of 2.0 μm, respectively, and formed by means of photolithography. FIG. 14 shows a microscopic photograph of green pattern having a pixel size of 2.0 μm and formed by means of dry-etching method. It will be recognized from FIGS. 12, 13 and 14 that while the green patterns formed by means of photolithography indicated prominently the generation of defective configuration (especially, as shown by the mark "C" of FIG. 12), the green pattern formed by means of dry-etching method indicated excellent configuration.

Since there is a problem when filter patterns are successively formed by means of dry etching that the roughness of the filter pattern that has been formed at first would give adverse influence to the color filter layers to be formed subsequently, it is preferable that when a color filter is consisted of three colors, the first color filter pattern should be formed by making use of dry etching, and when a color filter is consisted of four colors, the first color filter pattern or the first and the second color filter patterns should be formed by making use of dry etching, the rest of the color filters being formed by making use of photolithography in either cases.

Further, the resin to be contained in the green filter pattern may be selected so as to have a higher refractive index as compared with the resins to be contained in the blue and the red filter patterns. Conventionally, there has been a problem that since the refractive index of the green filter pattern is lower than the refractive indexes of other color filter patterns, the reflectance of the color filter becomes non-uniform. When it is desired to increase the refractive index of the green filter pattern, it may be conceivable to employ a resin having a higher refractive index. However, because of the restriction that the resin is subjected to photolithographic process, the freedom to select a suitable resin is very narrow and hence it has been very difficult to select a resin having a higher refractive index.

Whereas according to the method proposed by this aspect of the invention, since the green filter pattern can be formed by means of dry etching without necessitating the employment of photolithography, it is now possible to select the resin for the green filter pattern from various kinds of thermosetting resins exhibiting a higher refractive index.

As described above, when the resin to be contained in the green filter pattern is selected to have a higher refractive index as compared with that of the resins to be contained in the blue and the red filter patterns, the refractive indexes of these three color filters can be made nearly identical with each other. As a result, the light converging effect by the micro-lens can be made identical with other, thus making it possible to obtain an excellent solid state image pickup device.

Further, since a resin which is relatively high in refractive index tends to indicate a smaller etching rate, to perform the patterning of a layer containing a resin exhibiting a high refractive index by means of dry etching is effective in obtaining a filter pattern having a smooth surface.

In order to enable the refractive indexes of these color filter patterns to become almost identical with each other, the resin to be used in the green filter pattern should preferably be selected from those having a refractive index which is about 0.05 to 0.2 higher than that of the resins to be employed in other filter patterns.

Incidentally, as for the resin to be contained in the blue and the red filter patterns, it is possible to employ those having a refractive index ranging from 1.5 to 1.6 such as epoxy resin, polyimide resin, phenol novolac resin, polyester resin, urethane resin, melamine resin, urea resin, styrene resin, etc. As for the resin to be contained in the green filter pattern, it is possible to employ those having a refractive index ranging from 1.55 to 1.7 such as acrylic resin, epoxy resin, polyimide resin, phenol novolac resin, polyester resin, urethane resin, melamine resin, urea resin, styrene resin, a mixed resin containing one or more kinds of these resins such as a copolymer thereof. In particular, it is possible, for the purpose of achieving a high refractive index, to employ phenol resin, polystyrene resin, a polymer or monomer having benzene ring or aromatic ring introduced therein and also to employ acrylic resin having a halogen atom or sulfur atom introduced into the skeleton thereof.

Figure 6:
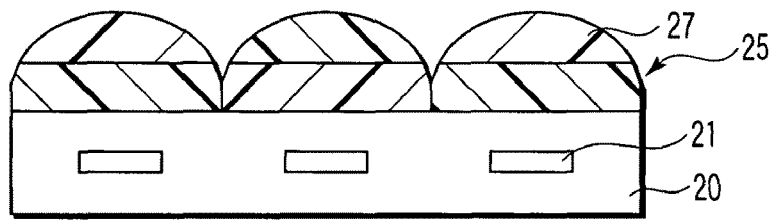
FIG. 6 is a cross-sectional view illustrating part of the solid state image pickup device according to another embodiment of the present invention.

As another aspect of the invention, as shown in FIG. 6, the micro-lens 27 may be formed directly on the surface of the color filter 25 and then a boundary portion between the neighboring filter patterns may be etched down to a depth of 0.03 μm-0.5 μm from the surface thereof. According to this structure, since the peripheral portion (lower portion) of the micro-lens is constituted by part (upper portion) of the color filter 25, it is possible to minimize the under-micro-lens distance, thus making it possible to obtain a solid state image pickup device which is excellent in sensitivity.

Incidentally, the reason for setting the lower limit of the depth to be dug down at the boundary portion between the neighboring filter patterns to 0.03 μm is that this value is the minimum value which SEM or AFM can effectively identify the thickness thereof. On the other hand, the reason for setting the upper limit thereof to 0.5 μm is that if the depth (step portion) is exceeded over 0.5 μm, the surface of film would be roughened giving rise to the generation of surface scattering, thus deteriorating the sensitivity. Furthermore, when this depth is exceeded over 0.5 μm, the effective film thickness of the color filter may become 1 μm or more for instance, thus rendering it contrary to one of the objects of the present invention to make thinner the color filter.

Figure 7:
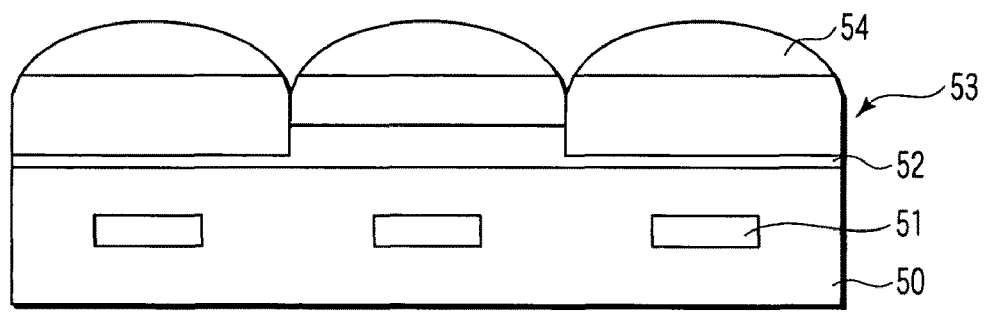
FIG. 7 is a cross-sectional view illustrating part of the solid state image pickup device according to another embodiment of the present invention.

FIG. 7 is a cross-sectional view illustrating part of the solid state image pickup device according to still another embodiment of the present invention. FIGS. 8A-8I are cross-sectional views each illustrating in step-wise the manufacturing method of a solid state image pickup device shown in FIG. 7. The plan view of FIG. 7 is identical with that shown in FIG. 5.

As shown in FIG. 7, the solid state image pickup device is constituted by a flattening layer 52 having a step portion and formed on a semiconductor substrate 50 provided therein with photoelectric conversion elements 51 which are arranged two-dimensionally and capable of converting the light into electric signals; a color filter 53 which is employed for color-separating an incident light and formed on the surface of the flattening layer 52; and a plurality of micro-lens 54 disposed on this color filter 52.

This solid state image pickup device can be manufactured according to the method shown in FIGS. 8A-8I.

Figure 8A:
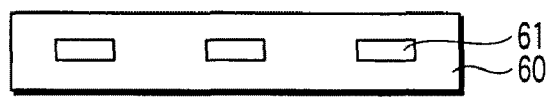
FIG. 8A is a cross-sectional view illustrating in step-wise the manufacturing method of a solid state image pickup device according to another embodiment of the present invention.
Figure 8B:
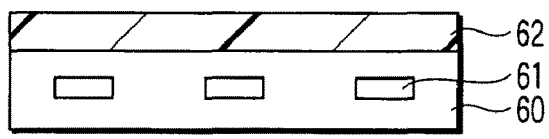
FIG. 8B is a cross-sectional view illustrating in step-wise the manufacturing method of a solid state image pickup device according to another embodiment of the present invention.

First of all, as shown in FIG. 8B, the first flattening layer 62 is formed on the surface of semiconductor substrate 60 provided with photoelectric conversion elements 61 which are two-dimensionally arranged thereon (see FIG. 8A). As for the materials for this flattening layer, it is possible to employ acrylic resin, epoxy resin, polyimide resin, phenol novolac resin, polyester resin, urethane resin, melamine resin, urea resin, styrene resin, a mixed resin containing one or more kinds of these resins.

Figure 8C:
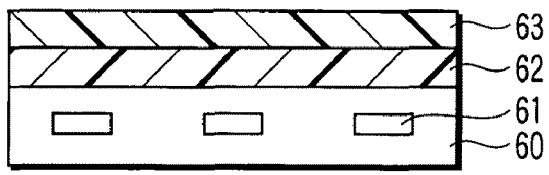
FIG. 8C is a cross-sectional view illustrating in step-wise the manufacturing method of a solid state image pickup device according to another embodiment of the present invention.

Then as shown in FIG. 8C, a green resist layer 63 is formed on the surface of the first flattening layer 62. This green resist layer 63 can be formed as follows. Namely, a resin dispersion comprising, as a major component, a thermosetting resin, and a green pigment is coated on the surface of the first flattening layer 62 and then thermally cured to form the green resist layer 63.

Figure 8D:
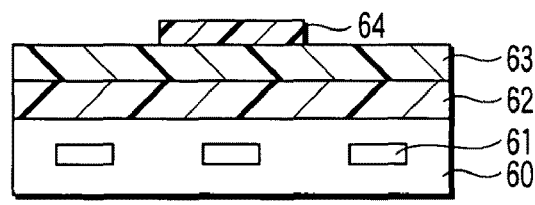
FIG. 8D is a cross-sectional view illustrating in step-wise the manufacturing method of a solid state image pickup device according to another embodiment of the present invention.

Then, as shown in FIG. 8D, by means of photolithography for example, a prescribed resin pattern 64 is formed on this green resist layer 63. As for the material for the resin pattern 64, it is possible to employ a photosensitive resin such as acrylic resin, epoxy resin, polyimide resin, phenol novolac resin. These resins can be employed singly or as a combination thereof or as a copolymer thereof. As for the light exposure apparatus to be employed in the photolithography process for patterning the photosensitive resin, it is possible to employ those explained with reference to the step of the aforementioned embodiment shown in FIG. 4C.

Figure 8E:
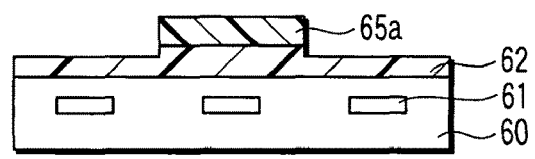
FIG. 8E is a cross-sectional view illustrating in step-wise the manufacturing method of a solid state image pickup device according to another embodiment of the present invention.

Then, as shown in FIG. 8E, by making use of the resin pattern 64 as a mask, the green resist layer 63 is patterned by means of dry etching to form a green filter pattern 65a. On this occasion, an unnecessary portion of the green resist layer is removed and also an upper portion of the flattening layer which is located below the unnecessary portion of the green resist layer is removed.

As for the method of dry etching, it is possible to employ, for example, ECR, a parallel plate magnetron, DRM, ICP, double-frequency type RIE, etc.

The gas to be employed in the dry etching may be a reactive (oxidizing or reductive) gas, i.e., a gas having etching properties. For example, it is possible to employ, though not limited, a gas containing, in its molecule, a halogen such as fluorine, chlorine, bromine, etc.; or a gas containing, in its molecule, oxygen or sulfur atom.

Figure 8F:
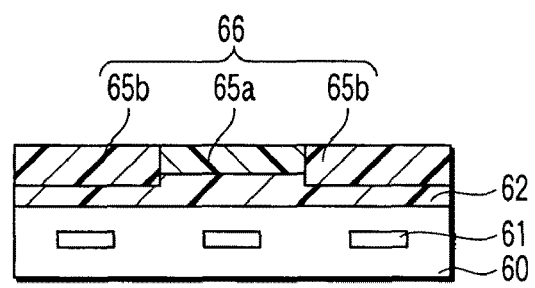
FIG. 8F is a cross-sectional view illustrating in step-wise the manufacturing method of a solid state image pickup device according to another embodiment of the present invention.

Subsequently, a blue filter pattern 65b and a red filter pattern (not shown) are successively formed by means of photolithography to form a color filter 66 comprising the green, the blue and the red filter patterns as shown in FIG. 8F.

FIG. 5 illustrates the arrangement of each of the filter patterns of the color filter 66. The arrangement shown in FIG. 5 is a so-called Bayer arrangement wherein every other pixel is a green (G) filter, and wherein the green (G) filters are alternated with red (R) filters in the odd rows and blue (B) filters in the even rows (or vice versa). FIG. 7 is a cross-sectional view taken along the line A-A' of FIG. 5.

Figure 8G:
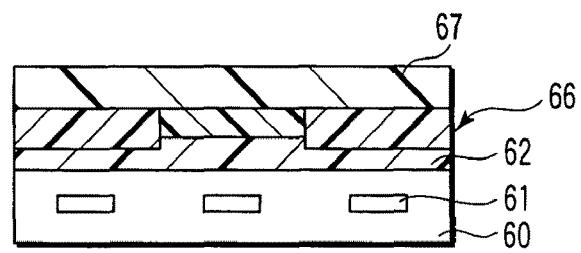
FIG. 8G is a cross-sectional view illustrating in step-wise the manufacturing method of a solid state image pickup device according to another embodiment of the present invention.

Then, as shown in FIG. 8G, a second flattening layer 67 is deposited on the color filter 66 which has been fabricated as described above. As for the material for the second flattening layer, it is possible to employ acrylic resin, epoxy resin, polyimide resin, phenol novolac resin, polyester resin, urethane resin, melamine resin, styrene resin, etc. These resins can be employed singly or in combination of two or more kinds thereof.

Figure 8H:
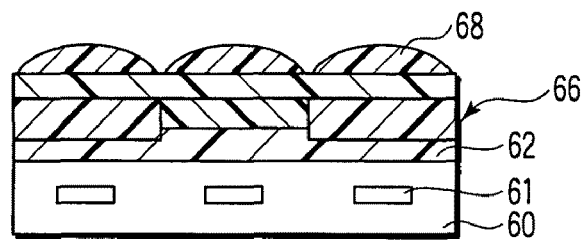
FIG. 8H is a cross-sectional view illustrating in step-wise the manufacturing method of a solid state image pickup device according to another embodiment of the present invention.

Then, as shown in FIG. 8H, a lens-shaped mother die 68 is formed on the surface of the second flattening layer 67 by means of the known thermal reflow method. As for the material for the lens-shaped mother die 68, it is possible to preferably employ a photosensitive resin. For example, resins excellent in alkaline solubility and thermal reflow property such as acrylic resin, phenol resin, polystyrene resin, etc. can be employed.

Figure 8I:
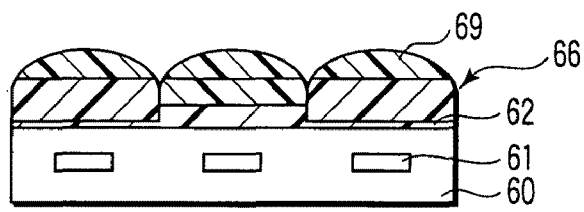
FIG. 8I is a cross-sectional view illustrating in step-wise the manufacturing method of a solid state image pickup device according to another embodiment of the present invention.

Finally, by making use of this lens-shaped mother die 68 as a mask, a dry etching treatment was performed, thereby transcribing the configuration of this lens-shaped mother die 68 to the second flattening layer 67, thus forming micro-lens 69. On this occasion, a boundary portion between the neighboring patterns of the color filter 66 was etched away from the surface to a depth ranging from 0.03 µm to 0.5 µm, thereby accomplishing the manufacture of the solid state image pickup device where a lower portion of the micro-lens is constituted by an upper portion of the color filter as shown in FIG. 8I.

In the manufacturing method of the solid state image pickup device as described above, since the green filter pattern 65a is formed by means of dry etching after the green resist layer 63 has been completely thermally cured, there is little possibility of generating defective pixels in the developing step to be carried out in a subsequent photolithography process.

In the embodiment explained above, the green filter pattern 65a should preferably be constituted by a filter pattern having the largest area among a plurality of filter patterns. By doing so, it is possible to further enhance the adhesion of the green filter pattern to an underlying substrate and to effectively prevent the generation of defective pixels. The size of the area of the green filter pattern having the largest area may be 1-2 times as large as that of the filter pattern having the smallest area among a plurality of filter patterns for instance. Additionally, since the filter pattern having the largest area has been patterned by means of dry etching, it is possible to more accurately perform the patterning of the filter pattern having the largest area, thereby making it possible to enhance the accuracy of the color filter as a whole. More specifically, the green filter pattern is more likely to be selected as having the largest area.

Further, when a color filter having a higher concentration of pigment, i.e., a color filter having a lower content of a resin having much to do with the curing of the color filter is patterned by means of dry etching, even the color filter layer which cannot be sufficiently cured in the ordinary photolithography can be patterned accurately without leaving the residue thereof and without generating the peeling thereof. More specifically, these effects would be more prominently manifested when the dry etching is applied to the formation of a red filter pattern or a green filter pattern.

Additionally, the patterning by means of dry etching is also useful in the patterning of such a kind of color filter that exhibits a low transmissivity to the exposure wavelength to be employed in the patterning by means of photolithography, resulting in insufficient exposure and hence leading to the deterioration of resolution and the generation of peeling. Namely, by making use of the dry etching, even the color filter layer which cannot be sufficiently cured in the ordinary photolithography can be patterned accurately without leaving the residue thereof and without generating the peeling thereof. Especially, these effects would be more prominently manifested when the dry etching is applied to the formation of a blue filter pattern.

Irrespective of the reasons, when the first filter pattern is formed by means of dry etching, it is possible to obtain a filter pattern which is excellent in resolution, capable of strongly adhering to the underlying substrate, and free from residues and peeling. Thereafter, the photolithography which is small in the number of steps and excellent in efficiency can be employed for the patterning for the rest of filter layers. As a result, it is possible, due to the filter pattern that has been formed at first with high accuracy and enabled to strongly adhere to the substrate, to form the rest of filter layers accurately and without generating the peeling thereof even if they are patterned by means of photolithography.

Since there is a problem when filter patterns are successively formed by means of dry etching that the roughness of the filter pattern that has been formed at first would give adverse influence to the color filter layers to be formed subsequently, it is preferable that when a color filter is consisted of three colors, the first color filter pattern should be formed by making use of dry etching, and when a color filter is consisted of four colors, the first color filter pattern or the first and the second color filter patterns should be formed by making use of dry etching, the rest of the color filters being formed by making use of photolithography in either cases.

Further, the resin to be contained in the green filter pattern may be selected so as to have a higher refractive index as compared with the resins to be contained in the blue and the red filter patterns. Conventionally, there has been a problem that since the refractive index of the green filter pattern is lower than the refractive indexes of other color filter patterns, the reflectance of the color filter becomes non-uniform. When it is desired to increase the refractive index of the green filter pattern, it may be conceivable to employ a resin having a higher refractive index. However, because of the restriction that the resin is subjected to photolithographic process, the freedom to select a suitable resin is very narrow and hence it has been very difficult to select a resin having a higher refractive index.

Whereas according to the method proposed by this aspect of the invention, since the green filter pattern can be formed by means of dry etching without necessitating the employment of photolithography, it is now possible to select the resin for the green filter pattern from various kinds of thermosetting resins exhibiting a higher refractive index.

As described above, when the resin to be contained in the green filter pattern is selected to have a higher refractive index as compared with that of the resins to be contained in the blue and the red filter patterns, the refractive indexes of these three color filters can be made nearly identical with each other. As a result, the light converging effect by the micro-lens can be made identical with other, thus making it possible to obtain an excellent solid state image pickup device.

Further, since a resin which is relatively high in refractive index tends to indicate a smaller etching rate, to perform the patterning of a layer containing a resin exhibiting a high refractive index by means of dry etching is effective in obtaining a filter pattern having a smooth surface.

In order to enable the refractive indexes of these color filter patterns to become almost identical with each other, the resin to be used in the green filter pattern should preferably be selected from those having a refractive index which is about 0.05 to 0.2 higher than that of the resins to be employed in other filter patterns.

Incidentally, as for the resin to be contained in the blue and the red filter patterns, it is possible to employ those having a refractive index ranging from 1.5 to 1.6 such as epoxy resin, polyimide resin, phenol novolac resin, polyester resin, urethane resin, melamine resin, urea resin, styrene resin, etc. As for the resin to be contained in the green filter pattern, it is possible to employ those having a refractive index ranging from 1.55 to 1.7 such as acrylic resin, epoxy resin, polyimide resin, phenol novolac resin, polyester resin, urethane resin, melamine resin, urea resin, styrene resin, a mixed resin containing one or more kinds of these resins such as a copolymer thereof. In particular, it is possible, for the purpose of achieving a high refractive index, to employ phenol resin, polystyrene resin, a polymer or monomer having benzene ring or aromatic ring introduced therein and also to employ acrylic resin having a halogen atom or sulfur atom introduced into the skeleton thereof.

Further, as shown in FIG. 8I, since a boundary portion between the neighboring filter patterns is dug down to a depth of 0.03 μm-0.5 μm from the surface thereof and the peripheral portion of the micro-lens is constituted by part of the color filter 66 in the step of forming the micro-lens, it is possible to minimize the under-micro-lens distance, thus obtaining a solid state image pickup device which is excellent in sensitivity.

Incidentally, the reason for setting the lower limit of the depth to be dug down at the boundary portion between the neighboring filter patterns to 0.03 μm is that this value is the minimum value which SEM or AFM can effectively identify the thickness thereof. On the other hand, the reason for setting the upper limit thereof to 0.5 μm is that if the depth is exceeded over 0.5 μm, the surface of film would be roughened giving rise to the generation of surface scattering, thus deteriorating the sensitivity. Furthermore, when this depth is exceeded over 0.5 μm, the effective film thickness of the color filter may become 1 μm or more for instance, thus rendering it contrary to one of the objects of the present invention to make thinner the color filter.

Next, the present invention will be more specifically explained with reference to various embodiments of the present invention.

EXAMPLE 1

The method of manufacturing the solid state image pickup device according to this example will be explained with reference to FIGS. 4A to 4G.

A pigment-dispersed green resist was spin-coated at a rotational speed of 1000 rpm on the surface of a semiconductor substrate 20 provided with photoelectric conversion elements 21 which are two-dimensionally arranged as shown in FIG. 4A. Then, the coated layer was baked for 6 minutes at a temperature of 230° C. to form a green resist layer 22 as shown in FIG. 4B. On this occasion, a green pigment represented by a color index of C.I.PG36 was employed at a concentration of 35 wt % and the film thickness of the green resist layer 22 was 0.6 μm. Further, a thermosetting acrylic resin was employed as a resin or a major component of the green resist.

Then, a coating solution containing an acrylic photosensitive resin as a major component was spin-coated on the surface of the green resist layer 22 at a rotational speed of 3000 rpm and then formed into a pattern by means of photolithography to obtain a resin pattern 23 as shown in FIG. 4C. Subsequently, by making use of this resist pattern 23 as a mask, the green resist layer 22 was subjected to an etching treatment by making use of a flon gas in a dry etching apparatus, thus forming a green filter pattern 24a as shown in FIG. 4D. The film thickness of the green filter pattern 24a on this occasion was 0.8 µm.

Then, by making use of a pigment-dispersed blue resist and by way of the same patterning method using dry etching as employed for the green filter pattern 24a, a blue filter pattern 24b was formed as shown in FIG. 4E. On this occasion, pigments represented, respectively, by a color index of C.I.PB156 and a color index of C.I.PV23 were employed in the blue resist at a concentration of 40 wt % and the film thickness of the blue resist layer 22 was 0.8 µm. Further, a thermosetting acrylic resin was employed as a resin or a major component of the blue resist.

Subsequently, by making use of a pigment-dispersed red resist and by way of photolithography, a red filter pattern (not shown) was formed to obtain a color filter 25. On this occasion, pigments having, respectively, a color index of C.I.PR117, a color index of C.I.PR48:1 and a color index of C.I.PY139 were employed in the red resist at a concentration of 45 wt % and the film thickness of the red resist layer 22 was 0.8 µm.

Further, a coating solution containing acrylic resin was spin-coated on the surface of color filter 25 formed as described above at a rotational speed of 1000 rpm. Then, the coated layer was heat-treated for 10 minutes over a hot plate at a temperature of 200° C., thereby curing the resin to form a flattening layer 26 as shown in FIG. 4F.

Finally, as shown in FIG. 4G, a micro-lens 27 was formed on the surface of the flattening layer 26 by means of the conventional thermal reflow method, thus accomplishing a solid state image pickup device.

In the case of the solid state image pickup device thus obtained, since the color filter 25 was directly formed on the surface of the semiconductor substrate 20 and furthermore since a thermosetting resin was employed to thereby make it possible to increase the concentration of coloring material in a solid matter, it was possible to form a thin color filter 25. As a result, it was possible to minimize the under-lens distance and to improve the sensitivity. Further, it was possible to prevent the generation of color uneven that may be caused by the configuration of the edge of pattern of the color filter.

In this embodiment, although a thermosetting acrylic resin was employed as a major component of the green resist as well as the blue resist that have been formed by means of shape transcription technique employing dry etching, it is possible to employ, other than the acrylic resin, epoxy resin, polyimide resin, phenol novolac resin, polyester resin, urethane resin, melamine resin, urea resin, styrene resin, and a mixed resin containing one or more kinds of these resins such as a copolymer thereof.

Further, it is possible to employ a resin of high refractive index for the green resist, thereby making it possible to adjust the refractive indexes of the green filter pattern, the red filter pattern and the blue filter pattern so as to make them almost the same with each other. As a result, it is possible to obtain a solid state image pickup device which is low in surface reflection and excellent in sensitivity.

Further, in this embodiment, although the green filter pattern and the blue filter pattern were formed by making use of a patterning technique using dry etching and the red filter pattern was formed by making use of photolithography, only the green filter pattern may be formed by the patterning technique using dry etching, the blue filter pattern and the red filter pattern being formed by means of photolithography. Alternatively, the green filter pattern and the red filter pattern may be formed by making use of a patterning technique using dry etching and only the blue filter pattern is formed by making use of photolithography. What is important is that the filter pattern to be initially formed should be formed by means of dry etching and the filter pattern to be finally formed should be formed by means of photolithography. However, since the green filter pattern and the blue filter pattern that have been formed by means of photolithography are more liable to be peeled as compared with the red filter pattern, these green and blue filter patterns should preferably be formed by means of patterning technique using dry etching.

Further, in this embodiment, although the micro-lens were formed by means of thermal reflow method, it is more preferable to form the micro-lens by means of patterning technique using dry etching, which makes it possible to reduce the under-micro-lens thickness. This patterning technique using dry etching is performed as follows. Namely, a transparent resin layer to be finally formed into micro-lens is formed on the surface of color filter and then a mother die of micro-lens (lens-shaped mother die) is formed thereon by means of thermal reflow method. Then, by making use of this lens-shaped mother die as a mask, the configuration of this lens-shaped mother die is transcribed to the transparent resin layer by means of dry etching. It is preferable in this case to dig away a boundary portion between neighboring filter patterns from the surface to a depth ranging from 0.03 µm to 0.5 µm through the adjustment of the height of this lens-shaped mother die to be employed in the transcription of lens configuration or through the adjustment of the etching rate by suitably selecting the material, thereby constituting the peripheral portion of micro-lens by part of the color filter, thus making it possible to minimize the under-lens distance.

Incidentally, although a thermosetting acrylic resin was employed as a resin for the green resist in this embodiment, it is also possible to employ the same kind of radiation-curing (photo-curing) acrylic resin as the resin employed in the red resist or the blue resist. In this case, it is preferable, for the purpose of reducing the thickness of color filter, to reduce the quantity of a monomer or a photo-polymerization initiator required to be employed. More preferably, a resin which is similar to the thermosetting resin is employed. The resin in this case is no longer suited for use in the exposure/development process.

EXAMPLE 2

The method of manufacturing the solid state image pickup device according to this example will be explained with reference to FIGS. 8A to 8I.

A coating solution containing acrylic resin as a major component was spin-coated at a rotational speed of 2000 rpm on the surface of a semiconductor substrate 60 provided with photoelectric conversion elements 61 which are two-dimensionally arranged as shown in FIG. 8A. Then, the coated layer was baked by means of a hot plate for 6 minutes at a temperature of 230° C. to form a first flattening layer 62 as shown in FIG. 8B. In this case, the thickness of the first flattening layer 62 was 0.45 µm.

Then, a green resist was spin-coated at a rotational speed of 1000 rpm on the surface of the first flattening layer 62 and baked for 6 minutes at a temperature of 230° C. to form a green resist layer 83 as shown in FIG. 8C. On this occasion, a green pigment represented by a color index of C.I.PG36 was employed at a concentration of 35 wt % and the film thickness of the green resist layer 83 was 0.5 µm. Further, a thermosetting acrylic resin of high refractive index was employed as a resin or a major component of the green resist. Therefore, the refractive index of the green resist layer 63 was 1.65.

Since a thermosetting acrylic resin of high refractive index was employed as described above, it was possible to dispense with the employment of a sensitizer such as a photopolymerization initiator though a heat-curing agent was required to be employed. Furthermore, since photolithographic properties such as alkaline-developing property or photo-curing property are no longer necessitated in this case, it was possible to increase the concentration of pigment, thus making it possible to obtain a green filter having desirable spectral properties even though the thickness of the green filter was reduced.

Then, a coating solution containing an acrylic photosensitive resin as a major component was spin-coated on the surface of the green resist layer 63 at a rotational speed of 3000 rpm and then formed into a pattern by means of photolithography to obtain a transparent resin pattern 64 as shown in FIG. 8D. In this case, since it was possible to select, as a mask, a transparent resin which does not contain any substance which may obstruct the resolution such as pigment, it was possible to perform the patterning with high precision.

Subsequently, by making use of this transparent resin pattern 64 as a mask, the green resist layer 63 was subjected to an etching treatment by making use of a flon gas in a dry etching apparatus, thus forming a green filter pattern 65a as shown in FIG. 8E. The film thickness of the green filter pattern 65a on this occasion was 0.5 µm. Further, since the first flattening layer 62 was also partially removed, a step portion having a height of 0.4 µm was caused to create between the neighboring first flattening layers 62.

Subsequently, by means of photolithography, a blue filter pattern 65b and a red filter pattern (not shown) were successively formed to obtain a color filter 66 as shown in FIG. 8F. On this occasion, pigments represented, respectively, by a color index of C.I.PB15:6 and a color index of C.I.PV23 were employed in the blue resist at a concentration of 30 wt % and the film thickness of the blue resist layer was 0.9 µm and the refractive index thereof was 1.64. Further, pigments represented, respectively, by a color index of C.I.PR117, a color index of C.I.PR117 and a color index of C.I.PV139 were employed in the blue resist at a concentration of 40 wt % and the film thickness of the blue resist layer was 0.9 µm and the refractive index thereof was 1.69.

Further, a coating solution containing acrylic resin incorporated therein with a UV absorber was spin-coated at a rotational speed of 1000 rpm on the surface of the color filter 66 formed as described above. Then, the coated layer was baked by means of a hot plate for 10 minutes at a temperature of 200° C. to cure the acrylic resin to form a second flattening layer 67 as shown in FIG. 8G.

Then, as shown in FIG. 8H, a lens-shaped mother die 68 formed of acrylic resin excellent in photosensitivity and in thermal reflow property was formed on the surface of the second flattening layer 67 by means of the known thermal reflow method.

Finally, by making use of this lens-shaped mother die 68 as a mask, an etching treatment was performed in a dry etching apparatus using a fluorocarbon gas, thereby transcribing the configuration of this lens-shaped mother die 68 to the second flattening layer 67, thus forming micro-lens 69. On this occasion, a boundary portion between the neighboring patterns of the color filter 66 was etched away from the surface to a depth of 0.2 µm, thereby accomplishing the manufacture of the solid state image pickup device as shown in FIG. 8I.

It was possible, through the manufacturing method of the solid state image pickup device as described above wherein the green filter pattern 65a was formed by means of dry etching, to form a thin color filter having a fine pattern and being excellent in configuration without generating the residue thereof and the peeling of pixel. Further, since a thermosetting resin was employed in the green filter layer, it was possible to increase the concentration of the coloring material in the solid matter, thereby making it possible to reduce the thickness of the color filter and hence to obtain a thin solid state image pickup device.

In this embodiment, although a thermosetting acrylic resin was employed as a major component of the green resist as well as the blue resist that have been formed by means of shape transcription technique employing dry etching, it is possible to employ, other than the acrylic resin, epoxy resin, polyimide resin, phenol novolac resin, polyester resin, urethane resin, melamine resin, urea resin, styrene resin, and a mixed resin containing one or more kinds of these resins such as a copolymer thereof.

In particular, it is possible, for the purpose of achieving a high refractive index, to employ phenol resin, polystyrene resin, a polymer or monomer having benzene ring or aromatic ring introduced therein and also to employ acrylic resin having a halogen atom or sulfur atom introduced into the skeleton thereof.

By doing so, it is possible to achieve a high refractive index even in the green filter pattern which is inherently lowest in refractive index and relatively large in surface reflection as compared with those of the blue filter pattern or the red filter pattern. As a result, it is possible to obtain a solid state image pickup device exhibiting excellent sensitivity.

In the foregoing embodiment, although only the green filter pattern was formed by way of patterning using dry etching, not only the blue filter pattern which can be easily peeled if it is formed by means of photolithography but also the red filter pattern which is high in concentration of pigment may be formed by making use of dry etching. However, since it is most important that the green filter pattern to be formed at first is excellent in adhesion and in accuracy of pattern, this green filter pattern is required to be formed by making use of the configuration transcription technique employing dry etching. Further, the red filter pattern may be formed, as a second color, next to the formation of the green filter pattern, it is more preferable that the blue filter pattern is formed, as a second color, next to the formation of the green filter pattern, since the red filter pattern contains a pigment at a high concentration, thus enabling the residue thereof to leave behind.

In this embodiment, although a step portion having a height of 0.4 µm was formed in the first flattening layer 62 which is formed below the color filter 66, this first flattening layer 62 may be etched to an extent ranging from 0.03 µm to 0.5 µm through the adjustment of the thickness of the transparent resin pattern 64 to be formed into a mother die in the formation of green filter pattern or through the adjustment of the etching rate by suitably selecting the material. The reason for setting the lower limit to 0.03 µm is that this value is the minimum value which SEM or AFM can effectively identify the thickness thereof. On the other hand, the reason for setting the upper limit to 0.5 µm is that if the height of the step portion is exceeded over 0.5 µm, the surface of film would be roughened giving rise to the generation of surface scattering, thus deteriorating the sensitivity.

Further, the micro-lens were formed by means of dry etching in this embodiment, the micro-lens may be formed by means of the conventional thermal reflow method. However, if it is desired to minimize the under-micro-lens distance, the micro-lens should preferably be formed by making use of the configuration transcription technique employing dry etching.

EXAMPLE 3

The method of manufacturing the solid state image pickup device according to this example will be explained with reference to FIGS. 8A to 8D and FIGS. 9A to 9E.

A coating solution containing acrylic resin as a major component was spin-coated at a rotational speed of 2000 rpm on the surface of a semiconductor substrate 60 provided with photoelectric conversion elements 61 which are two-dimensionally arranged as shown in FIG. 8A. Then, the coated layer was baked by means of a hot plate for 6 minutes at a temperature of 230° C. to form a first flattening layer 62 as shown in FIG. 8B. In this case, the thickness of the first flattening layer 62 was 0.4 µm.

Then, a green resist was spin-coated at a rotational speed of 1000 rpm on the surface of the first flattening layer 62 and baked for 6 minutes at a temperature of 230° C. to form a green resist layer 83 as shown in FIG. 8C. On this occasion, a green pigment represented by a color index of C.I.PG76 was employed at a concentration of 40 wt % and the film thickness of the green resist layer 83 was 0.5 µm. Further, a thermosetting acrylic resin of high refractive index was employed as a resin or a major component of the green resist. Therefore, the refractive index of the green resist layer 63 was 1.65.

Since a thermosetting acrylic resin of high refractive index was employed as described above, it was possible to dispense with the employment of a sensitizer such as a photopolymerization initiator though a heat-curing agent was required to be employed. Furthermore, since photolithographic properties such as alkaline-developing property or photo-curing property are no longer necessitated in this case, it was possible to increase the concentration of pigment, thus making it possible to obtain a green filter having a reduced thickness.

Then, a coating solution containing an acrylic photosensitive resin as a major component was spin-coated on the surface of the green resist layer 63 at a rotational speed of 3000 rpm and then formed into a pattern by means of photolithography to obtain a transparent resin pattern 64 as shown in FIG. 8D. In this case, since it was possible to select, as a mask, a transparent resin which does not contain any substance which may obstruct the resolution such as pigment, it was possible to perform the patterning with high precision.

Figure 9A:
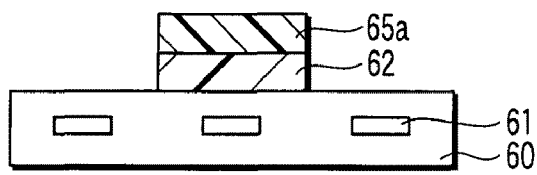
FIG. 9A is a cross-sectional view illustrating in step-wise the manufacturing method of a solid state image pickup device according to still another embodiment of the present invention.

Subsequently, by making use of this transparent resin pattern 64 as a mask, the green resist layer 63 was subjected to an etching treatment by making use of a flon gas in a dry etching apparatus, thus forming a green filter pattern 65a as shown in FIG. 9A. The film thickness of the green filter pattern 65a on this occasion was 0.5 µm. Further, a portion of the first flattening layer 62 which was not covered by the green filter pattern 65a was completely removed.

Figure 9B:
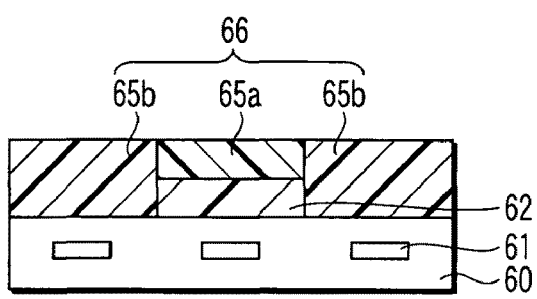
FIG. 9B is a cross-sectional view illustrating in step-wise the manufacturing method of a solid state image pickup device according to still another embodiment of the present invention.

Subsequently, by means of photolithography, a blue filter pattern 65b and a red filter pattern (not shown) were successively formed to obtain a color filter 66 as shown in FIG. 9B. On this occasion, pigments represented, respectively, by a color index of C.I.PB15:6 and a color index of C.I.PV63 were employed in the blue resist at a concentration of 30 wt % and the film thickness of the blue resist layer was 0.9 µm and the refractive index thereof was 1.64. Further, pigments represented, respectively, by a color index of C.I.PR117, a color index of C.I.PR117 and a color index of C.I.PV139 were employed in the blue resist at a concentration of 40 wt % and the film thickness of the blue resist layer was 0.9 µm and the refractive index thereof was 1.69.

Figure 9C:
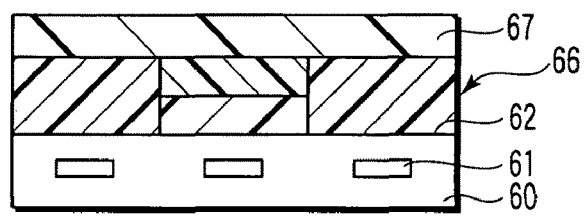
FIG. 9C is a cross-sectional view illustrating in step-wise the manufacturing method of a solid state image pickup device according to still another embodiment of the present invention.

Further, a coating solution containing acrylic resin incorporated therein with a UV absorber was spin-coated at a rotational speed of 1000 rpm on the surface of the color filter 66 formed as described above. Then, the coated layer was baked by means of a hot plate for 10 minutes at a temperature of 200° C. to cure the acrylic resin to form a second flattening layer 67 as shown in FIG. 9C.

Figure 9D:
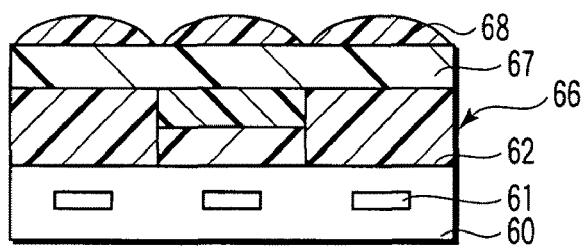
FIG. 9D is a cross-sectional view illustrating in step-wise the manufacturing method of a solid state image pickup device according to still another embodiment of the present invention.

Then, as shown in FIG. 9D, a lens-shaped mother die 68 formed of acrylic resin excellent in photosensitivity and in thermal reflow property was formed on the surface of the second flattening layer 67 by means of the known thermal reflow method.

Figure 9E:
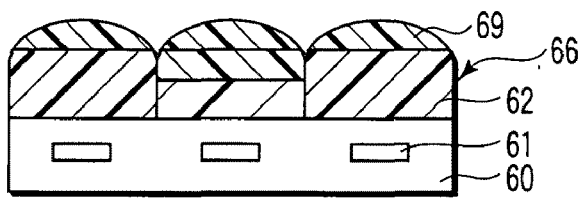
FIG. 9E is a cross-sectional view illustrating in step-wise the manufacturing method of a solid state image pickup device according to still another embodiment of the present invention.

Finally, by making use of this lens-shaped mother die 68 as a mask, an etching treatment was performed in a dry etching apparatus using a fluorocarbon gas, thereby transcribing the configuration of this lens-shaped mother die 68 to the second flattening layer 67, thus forming micro-lens 69. On this occasion, a boundary portion between the neighboring patterns of the color filter 66 was etched away from the surface to a depth of 0.1 µm, thereby accomplishing the manufacture of the solid state image pickup device where an upper portion of the color filter was employed to constitute part of the micro-lens as shown in FIG. 9E.

It was possible, through the manufacturing method of the solid state image pickup device as described above wherein the green filter pattern 65a was formed by means of dry etching, to form a thin color filter having a fine pattern and being excellent in configuration without generating the residue thereof and the peeling of pixel. Further, since a thermosetting resin was employed in the green filter layer, it was possible to increase the concentration of the coloring material in the solid matter, thereby making it possible to reduce the thickness of the color filter and hence to obtain a thin solid state image pickup device.

In this embodiment, although the first flattening layer 62 disposed below the filter pattern that will be formed by way of patterning using photolithography was completely removed, the first flattening layer 62 may be partially left remain through the adjustment of the thickness of the transparent resin pattern 64 to be formed into a mother die in the formation of green filter pattern or through the adjustment of the etching rate by suitably selecting the material. However, if it is desired to prevent the existence of residue of the color filter layer of the second color or the third color, the first flattening layer 62 should preferably be completely removed.

In this embodiment, although the micro-lens was formed by means of dry etching, the micro-lens may be formed according to the conventional thermal reflow method. However, if it is desired to minimize the under-micro-lens distance, the micro-lens should preferably be formed by making use of the configuration transcription technique employing dry etching.

In this embodiment, although the boundary portion between the neighboring color filters was etched to a depth of 0.1 µm from the surface and the peripheral portion of the micro-lens was constituted by part of the color filter, this boundary portion may be etched to a depth ranging from 0.03 µm to 0.5 µm depending on the height and material selected of lens-shaped mother die or depending on the material selected based on the construction, thickness and etching rate of the layer to which the lens configuration is transcribed. The reason for setting the lower limit to 0.03 µm is that this value is the minimum value which SEM or AFM can effectively identify the thickness thereof. On the other hand, the reason for setting the upper limit to 0.5 µm is that if the height of the step portion is exceeded over 0.5 μm, the surface of micro lens would be roughened giving rise to the generation of surface scattering, thus deteriorating the sensitivity.

What is claimed is:

1. A method of manufacturing a solid state image pickup device comprising photoelectric conversion elements which are two-dimensionally arranged in a semiconductor substrate, and a Bayer arrangement color filter comprising a plurality of color filter patterns differing in color from each other and disposed on a surface of the semiconductor substrate in a position corresponding to the photoelectric conversion elements, wherein said plurality of color filter patterns are formed by successively patterning a plurality of filter layers differing in color from each other, the method comprising:

dry etching a first color filter layer that contains a thermosetting resin through an etching mask to form a first color filter pattern of the plurality; and then successively forming the rest of the color filter patterns of the plurality, the formation of each of the rest of the color filter patterns comprising:

forming a color resist layer containing a photosensitive resin on the semiconductor substrate;

subjecting the color resist layer to a patterning exposure to selectively photo-cure the color resist layer; and subjecting the color resist layer to a development using a developing solution to remove an uncured portion of the color resist layer and form the filter pattern.

2. The method according to claim 1, wherein forming the first color filter pattern further comprises:

forming a photosensitive resin layer on the first color filter layer;

patterning the photosensitive resin layer to form a resin pattern;

performing the dry etching by using the resin pattern as the etching mask to transcribe a configuration of the resin pattern to the first color filter layer, and wherein the first color filter pattern is the largest in area among the plurality of color filter patterns.

* * * * *